US009543964B2

(12) United States Patent
Iwasa

(10) Patent No.: US 9,543,964 B2
(45) Date of Patent: *Jan. 10, 2017

(54) SEMICONDUCTOR DEVICE AND METERING APPARATUS

(71) Applicant: LAPIS Semiconductor Co., Ltd., Yokohama (JP)

(72) Inventor: Yosuke Iwasa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/928,183

(22) Filed: Oct. 30, 2015

(65) Prior Publication Data

US 2016/0049943 A1 Feb. 18, 2016

Related U.S. Application Data

(63) Continuation of application No. 14/025,721, filed on Sep. 12, 2013, now Pat. No. 9,252,779.

(30) Foreign Application Priority Data

Sep. 14, 2012 (JP) .................................. 2012-203060

(51) Int. Cl.
 *H03L 1/02* (2006.01)
 *H03B 5/04* (2006.01)
 (Continued)

(52) U.S. Cl.
 CPC ........... *H03L 1/02* (2013.01); *H01L 23/49575* (2013.01); *H01L 25/072* (2013.01); *H03B 5/04* (2013.01);
 (Continued)

(58) Field of Classification Search
 CPC .................................. H03L 1/022; H03B 5/04
 (Continued)

(56) References Cited

U.S. PATENT DOCUMENTS

| 5,500,628 A | 3/1996 | Knecht |
| 2003/0067361 A1 | 4/2003 | Takahashi et al. |

(Continued)

FOREIGN PATENT DOCUMENTS

| JP | 2003-224425 A | 8/2003 |
| JP | 2009-213061 A | 9/2009 |
| JP | 2010-034094 A | 2/2010 |

OTHER PUBLICATIONS

Japanese Office Action with translation dated Jun. 14, 2016.

*Primary Examiner* — Jeffrey Shin
(74) *Attorney, Agent, or Firm* — Rabin & Berdo, P.C.

(57) ABSTRACT

A semiconductor device includes: an oscillator; a semiconductor chip that includes an oscillation circuit connected to the oscillator, a timer circuit that generates a timing signal of a frequency according to a oscillation frequency of the oscillation circuit, and a frequency correction section that corrects a frequency of the timing signal based on temperature data; and a discrete device that includes at least one of a temperature sensing device that detects a peripheral temperature, that supplies the detected temperature as temperature data to the frequency correction section, and that is provided as a separate body to the semiconductor chip, or a capacitor that is electrically connected to both the oscillator and the oscillation circuit and that is provided as a separate body to the semiconductor chip, wherein the oscillator, the semiconductor chip and the discrete device are contained within a single package.

12 Claims, 25 Drawing Sheets

(51) Int. Cl.
*H01L 23/495* (2006.01)
*H01L 25/07* (2006.01)

(52) U.S. Cl.
CPC ..... *H03L 1/022* (2013.01); *H01L 2224/05554* (2013.01); *H01L 2224/48095* (2013.01); *H01L 2224/48228* (2013.01); *H01L 2224/48247* (2013.01); *H01L 2224/49109* (2013.01); *H01L 2924/181* (2013.01)

(58) Field of Classification Search
USPC .......................................... 331/69, 70, 176
See application file for complete search history.

(56) References Cited

U.S. PATENT DOCUMENTS

| | | |
|---|---|---|
| 2005/0012559 A1 | 1/2005 | Shimodaira et al. |
| 2010/0052802 A1* | 3/2010 | Arai .......................... H03L 1/04 331/69 |
| 2011/0187422 A1 | 8/2011 | Hammes et al. |
| 2011/0193637 A1* | 8/2011 | Kasahara ........... H03H 9/02102 331/68 |
| 2012/0229225 A1 | 9/2012 | Horie |

* cited by examiner

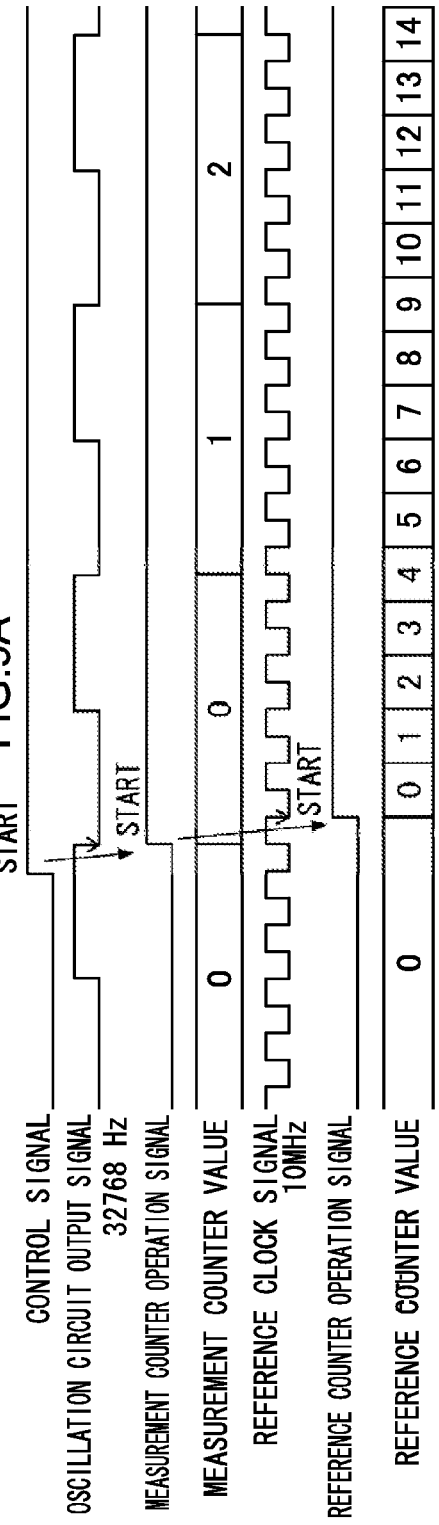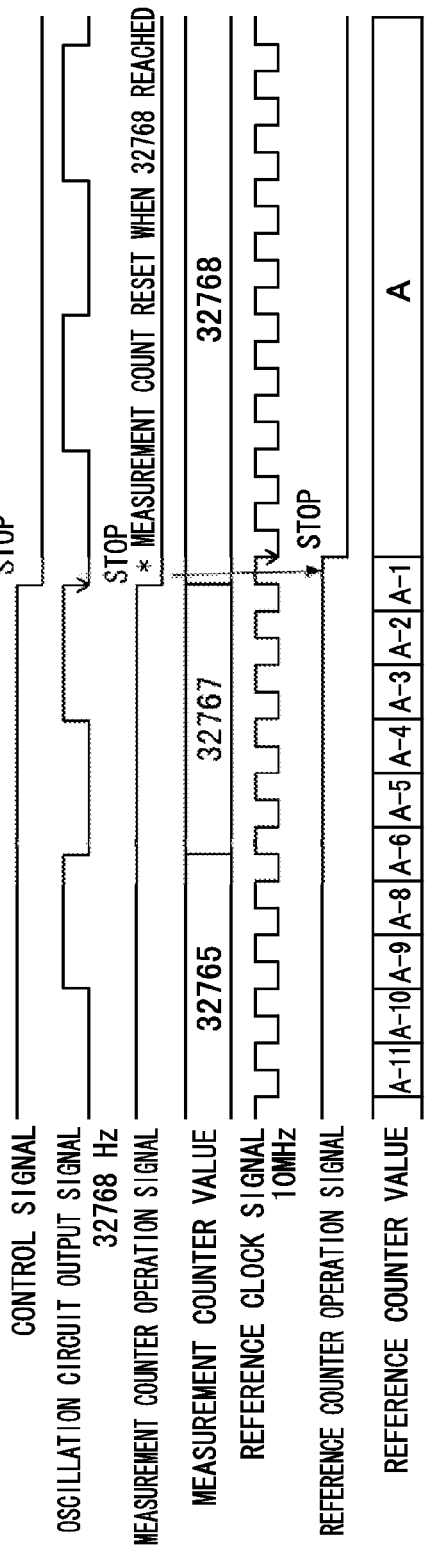

SEMICONDUCTOR DEVICE AND METERING APPARATUS

CROSS-REFERENCE TO RELATED APPLICATION

This is a continuation of U.S. application Ser. No. 14/025,721, filed on Sep. 12, 2013, and allowed on Jul. 23, 2015, which claimed priority under 35 USC 119 from Japanese Patent Application No. 2012-203060, filed on Sep. 14, 2012. The disclosures of these applications are incorporated by reference herein.

BACKGROUND

1. Technical Field

The present invention relates to a semiconductor device and to a metering apparatus, and in particular relates to a semiconductor device including an oscillation circuit containing an oscillator, and to a metering apparatus containing such a semiconductor device.

2. Description of the Related Art

There has been growing interest recently into "smart meters" that are implement by adding a high performance communication function to a meter, such as electricity, gas or water meter, so as to perform automatic reading and various types of service. With smart meters, various management and control functions are performed whilst ascertaining consumer usage history of electricity, gas or water in real time. Development is accordingly proceeding into meters that have an in-built semiconductor device with a time measurement function that accurately logs times irrespective of the environment in which the meter is installed. Semiconductor devices that have a time measurement function are generally configured to include an oscillator, an oscillation circuit that is connected to the oscillator, and a timer circuit that generates a timing signal of a specific frequency from an output signal of the oscillator. The oscillation circuit and the timer circuit are formed in the semiconductor integrated circuit.

As a semiconductor device with an oscillator and a semiconductor chip with an oscillation circuit connected to the oscillator in-built in the same package, Japanese Patent Application Laid-Open (JP-A) No. 2009-213061 describes using external terminals provided on an outer face of a vibrator and disposing the vibrator on one face of a wiring board, and disposing a semiconductor chip that is connected to the vibrator to cause it to oscillate disposed on the one face of the wiring board, alongside the vibrator. A resin molding member is then provided on the one face of the wiring board so as to cover the semiconductor chip.

There is also a circuit device described in JP-A No. 2010-34094 that is equipped with an IC chip that includes an oscillator, and a circuit section that configures an oscillation circuit for electrical connection to the oscillator. In this circuit device, the oscillator has plural electrodes, and there are plural oscillator pads corresponding to the plural electrodes of the IC chip, and the oscillator is electrically connected to the plural oscillator pads on the IC chip by its plural electrodes facing towards the plural oscillator pads on the IC chip through an Anisotropic Conductive Film (ACF).

SUMMARY OF THE INVENTION

An exemplary aspect of the present disclosure is a semiconductor device that includes: an oscillator; a semiconductor chip that includes an oscillation circuit connected to the oscillator, a timer circuit that generates a timing signal of a frequency according to a oscillation frequency of the oscillation circuit, and a frequency correction section that corrects a frequency of the timing signal based on temperature data; and a discrete device that includes at least one of a temperature sensing device that detects a peripheral temperature, that supplies the detected temperature as temperature data to the frequency correction section, and that is provided as a separate body to the semiconductor chip, or a capacitor that is electrically connected to both the oscillator and the oscillation circuit and that is provided as a separate body to the semiconductor chip, wherein the oscillator, the semiconductor chip and the discrete device are contained within a single package.

BRIEF DESCRIPTION OF THE DRAWINGS

Exemplary embodiments of the present invention will be described in detail based on the following figures, wherein:

FIG. 9A is a timing chart illustrating operation of a measurement counter and a reference counter in frequency error derivation processing according to an exemplary embodiment of the present invention;

FIG. 9B is a timing chart illustrating operation of a measurement counter and a reference counter in frequency error derivation processing according to an exemplary embodiment of the present invention;

DETAILED DESCRIPTION

Figure 1:
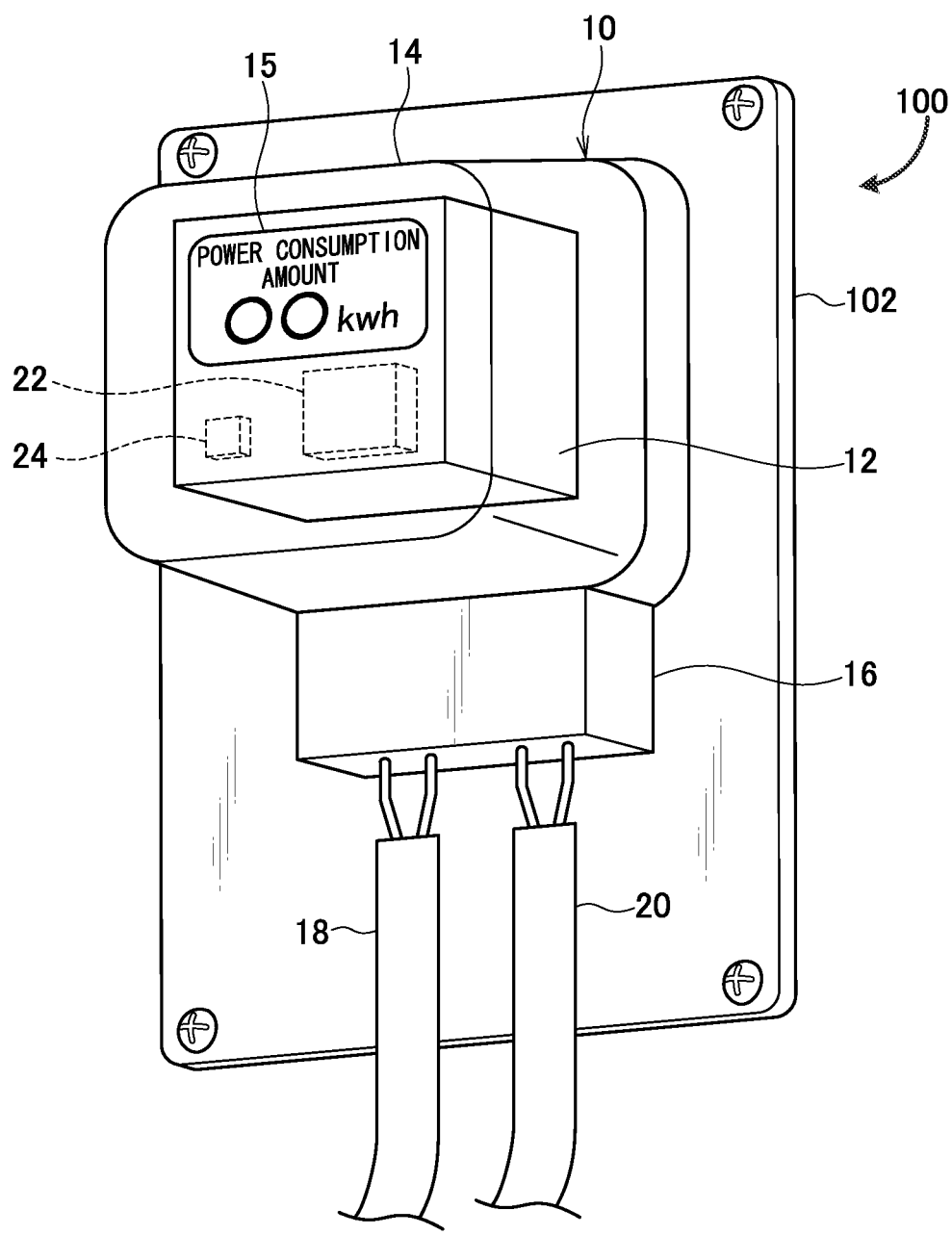
FIG. 1 is a perspective view of a configuration of an integrating electricity meter according to a first exemplary embodiment.

Explanation follows regarding exemplary embodiments of the present invention, with reference to the drawings. Note that the same or equivalent configuration elements and portions are allocated with the same reference numerals in each of the drawings.

First Exemplary Embodiment

Configuration of Integrating Electricity Meter

FIG. 1 is a perspective view of an integrating electricity meter 10 equipped with a semiconductor device 1 (FIG. 2) according to a first exemplary embodiment. The integrating electricity meter 10 is attached to a fixing plate 102 that is fixed to an external wall 100 of for example a house. The integrating electricity meter 10 principally includes: a main body 12; a transparent cover 14 that covers the main body 12; and a connection section 16 provided at a lower portion of the main body 12.

A power supply-side cable 18 and a load-side cable 20 are connected from below the connection section 16 and supply current to the integrating electricity meter 10. The main body 12 is a box body of rectangular shape when viewed face on (referred to below as plan view). The semiconductor device 1 and a power consumption metering circuit 22 are mounted on a base plate inside the main body 12. The power consumption metering circuit 22 serves as a metering section that generates timing data based on a measuring signal output from the semiconductor device 1 and measures integral power consumption associated with the timing data. Namely, the power consumption metering circuit 22 meters power consumption per unit time and integral power consumption for each separated time band. A liquid crystal display 15 is provided with its length aligned in a transverse direction on the front face of the main body 12. The liquid crystal display 15 displays such information as the power consumption per unit time as measured by the power consumption metering circuit 22 and the integral power consumption used in each time band. Note that although the integrating electricity meter 10 according to the present exemplary embodiment is an electronic electricity meter in which the power consumption metering circuit 22 is employed as the metering section, there is no limitation thereto. A rotating disk induction type electricity meter may for example be employed for measuring the power consumption. Moreover, although an explanation is given in the present exemplary embodiment of an example of the integrating electricity meter 10 that performs metering of power consumption as a metering device, a device may be employed that meters another metering commodity associated against time data other than electricity, such as for example water or gas.

Semiconductor Device Structure

Figure 2:
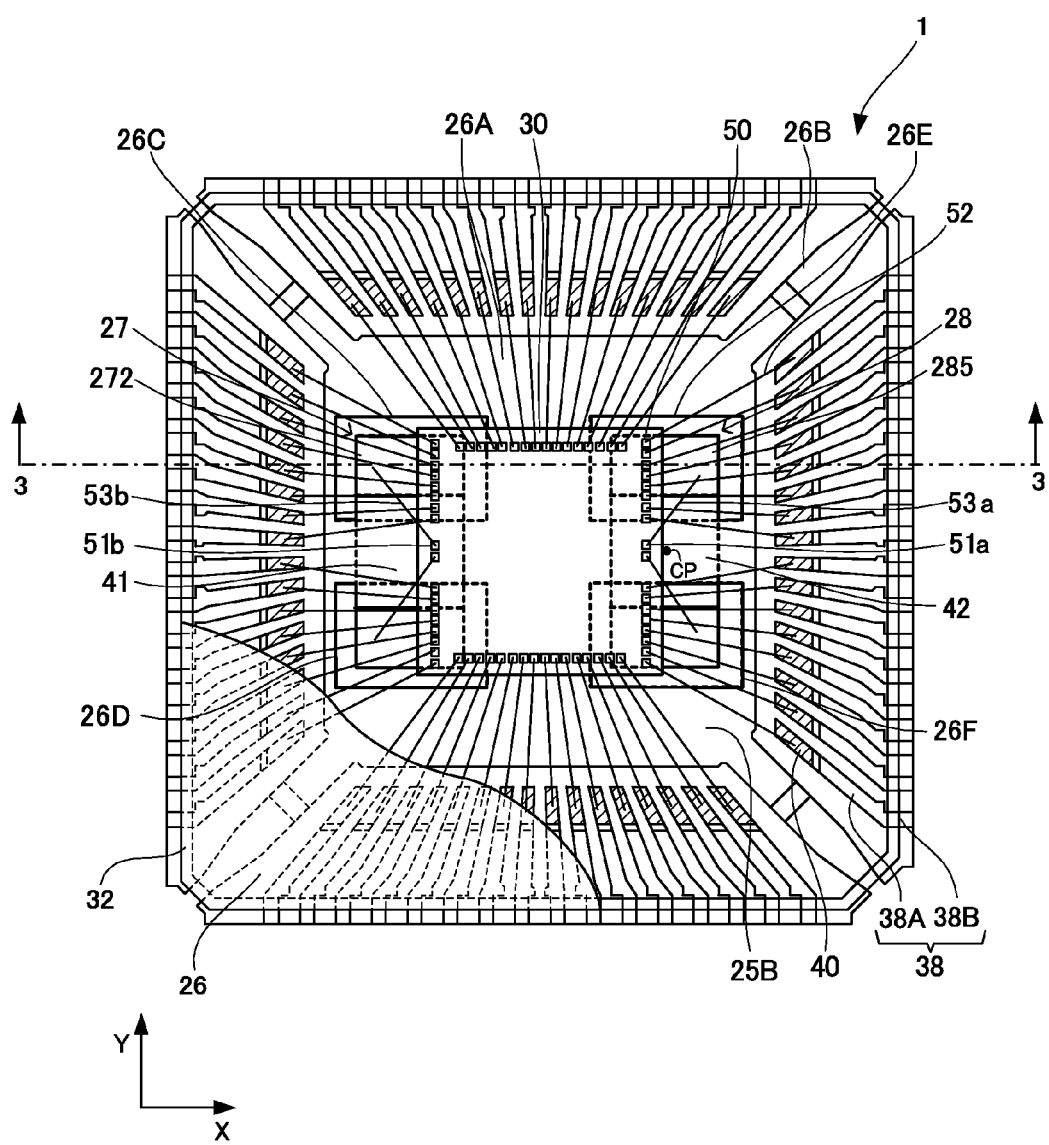
FIG. 2 is plan view illustrating a configuration of a semiconductor device according to the first exemplary embodiment of the present invention.
Figure 3:
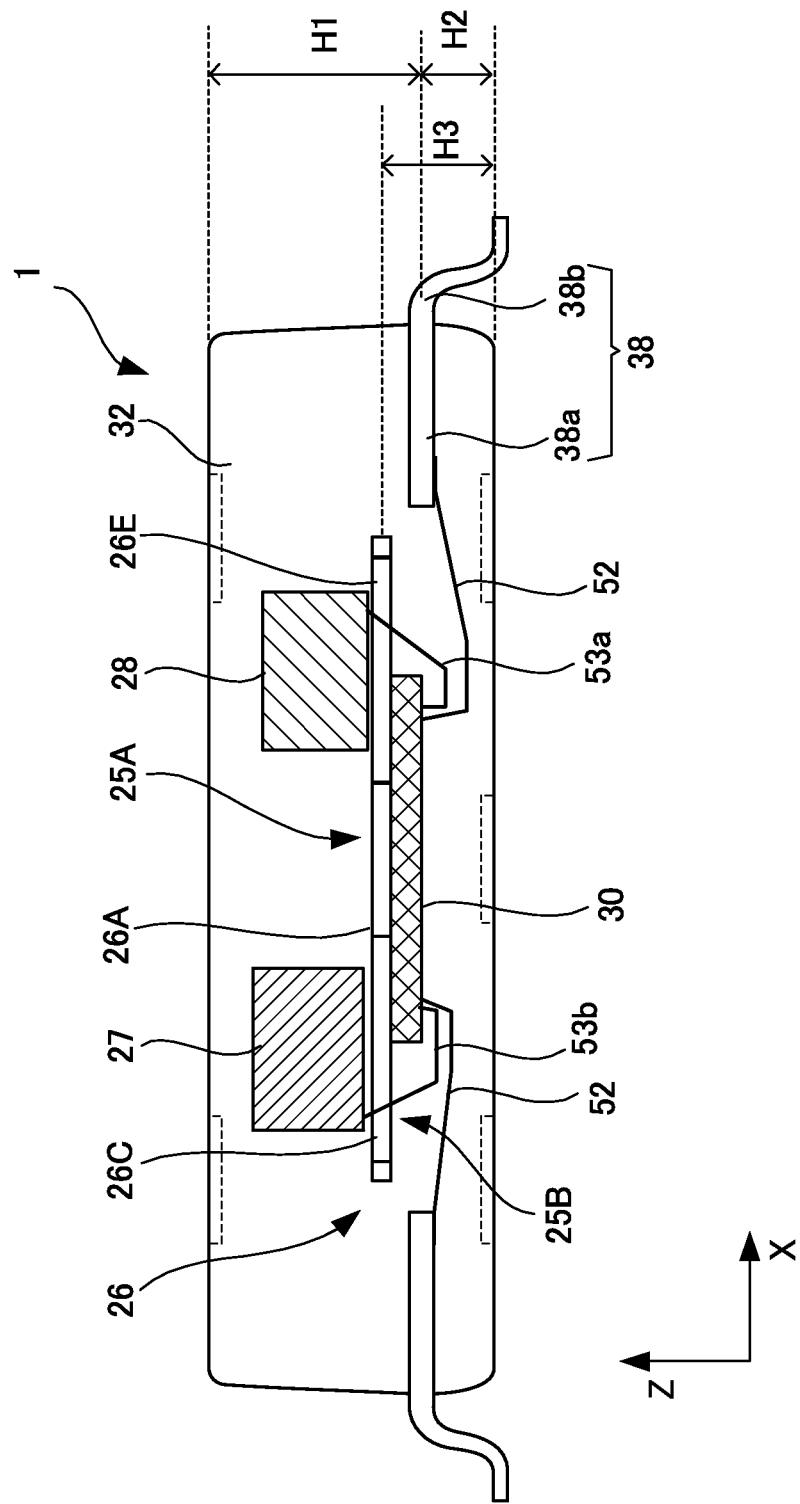
FIG. 3 is a cross-section taken along line 3-3 of FIG. 2.

FIG. 2 is a plan view illustrating a configuration of the semiconductor device 1 according to a first exemplary embodiment of the present invention, FIG. 3 is a cross-section taken on line 3-3 of FIG. 2. Note that in the FIG. 2 the left-right direction is the arrow X direction, and the up-down direction is the arrow Y direction, and the Z direction is a direction orthogonal to the X-Y plane. The external shape of the semiconductor device 1 is a rectangular shape in plan view, and the semiconductor device 1 includes a lead frame 26 that acts as a framework, a temperature sensing device (temperature sensor) 27 and an oscillator 28 mounted to a first main face 25A of a die pad 26A configuring the lead frame 26, a semiconductor chip 30 that is mounted to a second main face 25B of the lead frame 26 on the opposite side to the first main face 25A of the die pad 26A, and molding resin 32 that serves as a sealing member for these members mounted on the die pad 26A.

The lead frame 26 is a plate member formed from a flat sheet of a metal such as copper (Cu) or an iron (Fe) and nickel (Ni) alloy, by pressing out with a press. The lead frame 26 includes: a die pad 26A provided at a central portion; hanging leads 26B that extend outwards from the die pad 26A along diagonal lines; and plural leads (terminals) 38 provided between adjacent of the hanging leads 26B.

The leads 38 are long thin members extending towards a central portion of the die pad 26A, with plural of the leads 38 formed at a specific separation around the periphery of the die pad 26A. In the present exemplary embodiment there are 16 lines of the leads 38 formed between each adjacent pair of the hanging leads 26B. The leads 38 are configured from inner leads 38A that are positioned on the die pad 26A side and are buried in within molding resin 32, and outer leads 38B that are positioned at the outer peripheral end side of the semiconductor device 1 and exposed from the molding resin 32. The inner leads 38A are pressed down by a press so as to be lower than the die pad 26A and extend parallel to the die pad 26A (see FIG. 3). The leading end portions of the inner leads 38A nearest to the die pad 26A are covered with an electroplated film 40. In the present exemplary embodiment, as an example, the electroplated film 40 is formed from silver (Ag), however there is no limitation thereto, and for example an electroplated film formed from gold (Au) may be employed.

The outer leads 38B are exposed from the molding resin 32, and are bent downwards with their leading end portions parallel to the inner leads 38A. Namely the outer leads 38B are configured as gull-wing leads. The outer leads 38B are covered by an electroplated solder film. Substances which may be employed as an electroplated solder film include for example tin (Sn), a tin (Sn) and lead (Pb) alloy, and a tin (Sn) and copper (Cu) alloy.

The die pad 26A is a flat plate shaped formed with a rectangular shape in plan view. In the die pad 26A, through holes 26C, 26D, 26E, 26F are formed piercing from the first main face 25A to the second main face 25B of the die pad 26A. The through holes 26C to 26F are each respectively formed in a rectangular shape. In the present exemplary embodiment an example is given in which each of the through holes 26C to 26F is in a state surrounded on four sides by the lead frame 26, however the through holes 26C to 26F may be provided as C-shaped cutouts open on one side.

The through holes 26C and 26D are placed alongside each other in the Y direction, and a region between the through holes 26C and 26D configures a temperature sensing mounting beam 41 serving as a temperature sensing device mounting region for mounting the temperature sensing device 27. Similarly, the through holes 26E and 26F are placed alongside each other in the Y direction, and a region between the through holes 26E and 26F configures an oscillator mounting beam 42 serving as an oscillator mounting region for mounting the oscillator 28.

The oscillator 28 is joined to the oscillator mounting beam 42 on the first main face 25A side of the die pad 26A. In the present exemplary embodiment the oscillator 28 employed is a surface mounted type of oscillator with an oscillation frequency of 32.768 kHz for mounting to general electronic devices.

Figure 4:
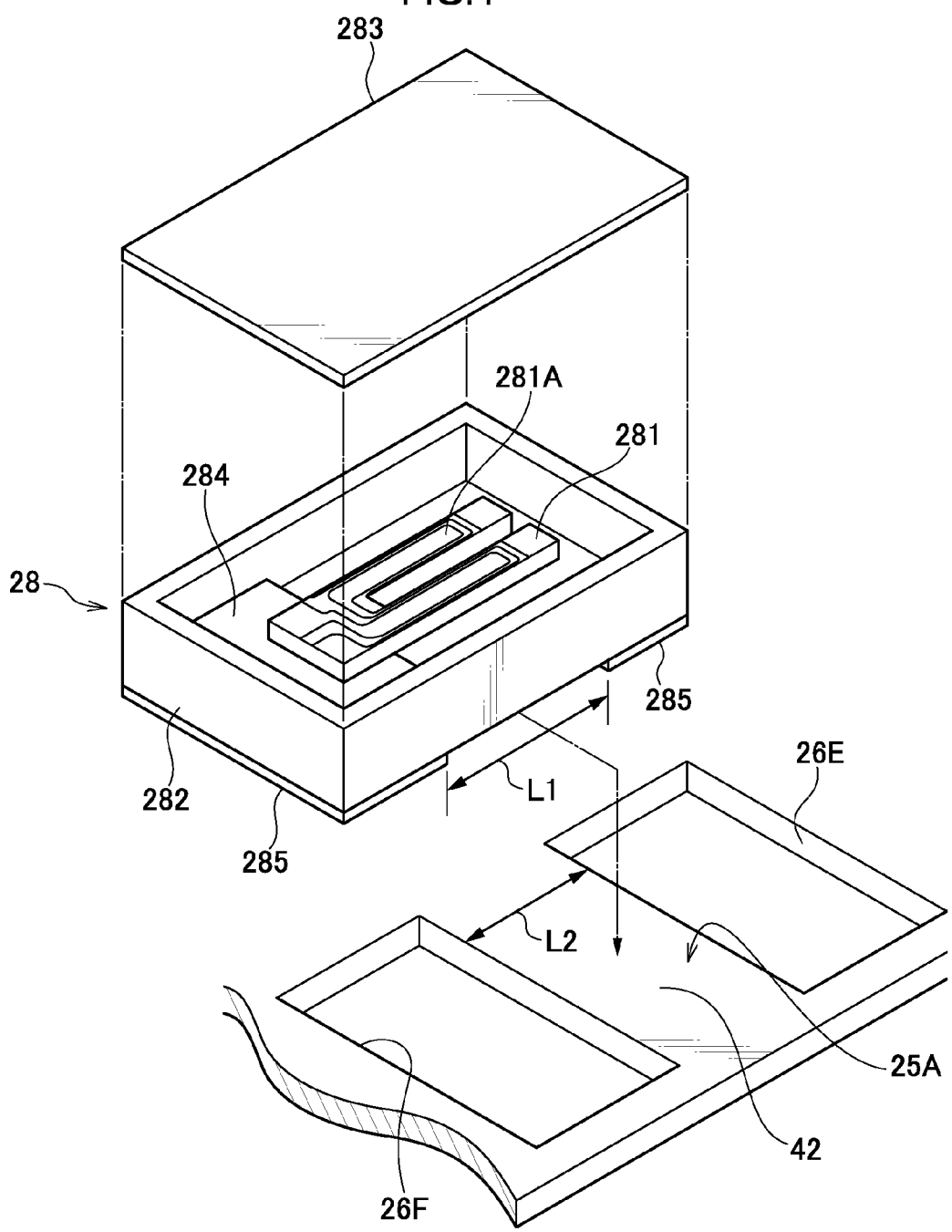
FIG. 4 is perspective view illustrating a configuration of an oscillator according to the first exemplary embodiment of the present invention.

FIG. 4 is a perspective view illustrating a configuration of the oscillator 28. Note that in FIG. 4 the through holes 26E and 26F formed in the die pad 26A and the oscillator mounting beam 42 are illustrated together with the oscillator 28. The oscillator 28 is configured including a vibrating reed 281, a rectangular box shaped package body 282 that houses the vibrating reed 281 and a lid 283. The vibrating reed 281 is a quartz oscillator crystal, with excitation electrodes 281A formed as a film on the surface of a tuning fork shaped quartz crystal formed from an artificial quartz crystal. The vibrating reed 281 vibrates due to a piezoelectric effect when current flows in the excitation electrodes 281A. The vibrating reed 281 is not limited to a tuning fork shape and an AT cut quartz crystal may be employed. Other than quartz, vibrating reeds formed from lithium tantalate (LiTaO3) or lithium niobate (LiNbO3) may also be employed. A MEMS vibrating reed formed from silicon may also be employed.

The package body 282 is a box body with an open upper portion. A seat 284 affixed with the vibrating reed 281 is formed at one length direction end side of a bottom portion of the package body 282. A base portion of the vibrating reed 281 is fixed to the seat 284, with the vibrating reed 281 hermetically sealed by the package body 282 and the lid being 283 joined together in a vacuum state so as to enable vibration. The two ends on the lower face of the package body 282 are formed with the external electrodes 285 as terminals that are electrically connected to the excitation electrodes 281A of the vibrating reed 281. The external electrodes 285 are formed separated from each other at a specific distance L1. The specific distance L1 between the external electrodes 285A is formed so as to be narrower than the width L2 of the oscillator mounting beam 42.

The external electrodes 285 are formed with widths (longer sides) the same as the width (the shorter side) of the package body 282. As illustrated in FIG. 2, the size of the external electrodes 285 is larger than the size of electrode pads 50 formed to the semiconductor chip 30 and oscillator electrode pads 51a, both described later. The external electrodes 285 are also formed smaller than the through holes 26E and 26F of the die pad 26A. The oscillator 28 is joined to the first main face 25A of the die pad 26A so as to straddle the oscillator mounting beam 42. The two external electrodes 285 formed at the two ends of the oscillator 28 are accordingly exposed to the second main face 25B side of the die pad 26A through the respective through holes 26E and 26F.

The temperature sensing device 27 is joined to the temperature sensing device mounting beam 41 formed between the through holes 26C and 26D on the first main face 25A side of the die pad 26A. In the present exemplary embodiment, the temperature sensing device 27 is a surface mounted type of thermistor whose resistance changes according to changes in temperature. The temperature sensing device 27 is for example configured by a ceramic semiconductor with principle materials of transition metal oxides of principally Mn, Co, Ni. Note that the temperature sensing device 27 may be configured from a conductive barium titanate based oxide semiconductor doped with minute quantities of rare earth elements. In such cases the resistance increases as the temperature rises.

Figure 5:
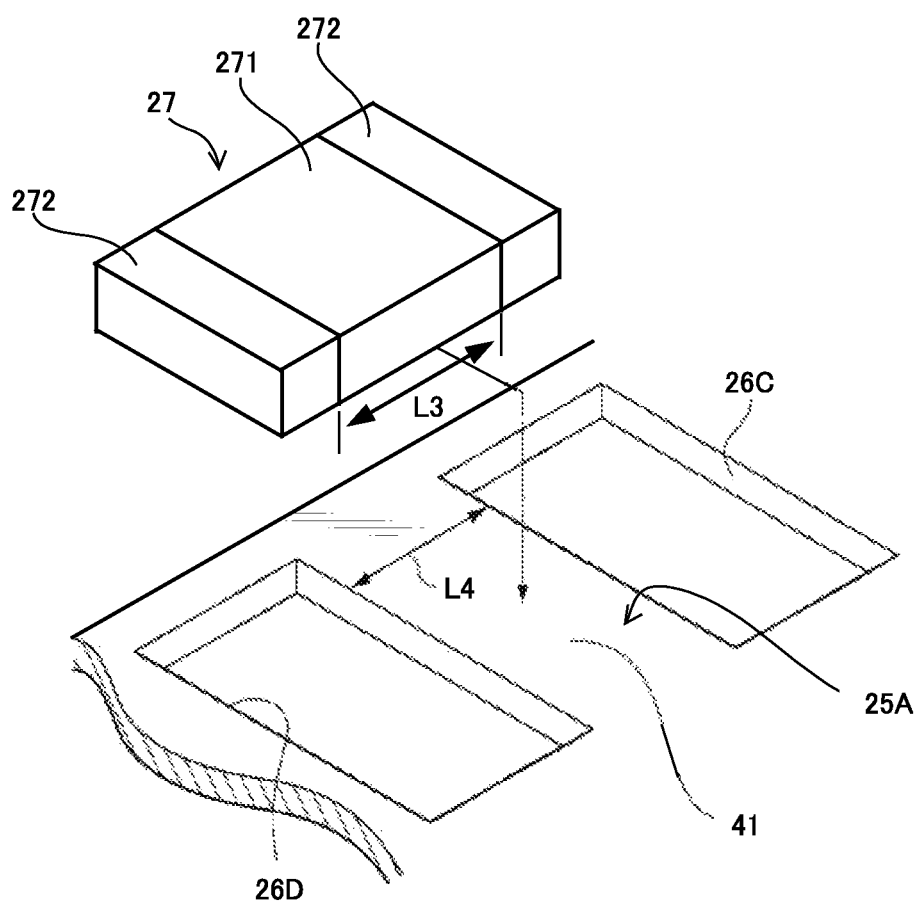
FIG. 5 is a perspective view illustrating a configuration of a temperature sensing device according to the first exemplary embodiment of the present invention.

FIG. 5 is a perspective view of a configuration of the temperature sensing device 27. Note that in FIG. 5, the through holes 26C and 26D formed in the die pad 26A and the temperature sensing device mounting beam 41 are illustrated together with the temperature sensing device 27. The temperature sensing device 27 is configured including a resistor 271 configured from a ceramic semiconductor or a barium titanate based oxide semiconductor, and external electrodes 272 provided at both ends of the resistor 271. A distance L3 between the external electrodes 272 is set larger than a width fold line L4 of the temperature sensing device mounting beam 41. As illustrated in FIG. 2, the size of the external electrodes 272 is larger than that of the electrode pads 50 and temperature sensing device electrode pads 51b formed to the semiconductor chip 30. The through holes 26C and 26D of the die pad 26A are formed larger than the external electrodes 272. The temperature sensing device 27 is joined to the first main face 25A of the die pad 26A so as to straddle the temperature sensing device mounting beam 41. The two external electrodes 272 at the two ends of the temperature sensing device 27 are accordingly exposed to the second main face 25B of the die pad 26A through the through holes 26C and 26D.

As illustrated in FIG. 2 and FIG. 3, the semiconductor chip 30 is mounted to the second main face 25B of the die pad 26A at a central portion of the die pad 26A. The semiconductor chip 30 is disposed so as to partially close off the through holes 26C to 26F formed in the die pad 26A, with the temperature sensing device 27 and the oscillator 28 partially overlapping with each other in a direction parallel to the first and second main faces 25A, 25B (the X-Y plane direction). At the portions of the through holes 26C to 26F not closed off by the semiconductor chip 30, the external electrodes 272 of the temperature sensing device 27 and the external electrodes 285 of the oscillator 28 are exposed to the second main face 25B side mounted with the semiconductor chip 30. Namely, as illustrated in FIG. 2, the external electrodes 272 of the temperature sensing device 27 are exposed to the second main face 25B side through the through holes 26C and 26D extending at the outside on the left hand side edge of the semiconductor chip 30, and the external electrodes 28S of the oscillator 28 are exposed to the second main face 25B side through the through holes 26E and 26F extending at the outside on the right hand side edge of the semiconductor chip 30.

The plural electrode pads 50 are provided at an outer peripheral portion of each of the sides of the semiconductor chip 30 so as to form a rectangular shape. The electrode pads 50 are respectively electrically connected to the inner leads 38A through bonding wires 52. Note that in the present exemplary embodiment, the number of the electrode pads 50 matches the number of the leads 38, and there are 16 individual electrode pads 50 provided at each edge of the semiconductor chip 30. However there is no limitation thereto, and more of the electrode pads 50 for other purposes may be provided than the number of leads 38.

The oscillator electrode pads 51a connected to the oscillator 28 are provided separately to the electrode pads 50 on the oscillator 28 side edge of the semiconductor chip 30. Two of the oscillator electrode pads 51a are provided above the oscillator mounting beam 42 that is at a Y direction central portion of the semiconductor chip 30. The oscillator electrode pads 51a are respectively electrically connected by bonding wires 53a to the external electrodes 28S of the oscillator 28 that are exposed to the second main face 25B side of the die pad 26A through the through holes 26E and 26F. Note that the bonding wires 52 and the bonding wires 53a are wire shaped conductive members formed from a metal such as gold (Au), aluminum (Al) or copper (Cu). The oscillator electrode pads 51a connected to oscillator 28 are provided separated from the electrode pads 50 provided on the same side of the semiconductor chip 30. In other words, the separation distance between the oscillator electrode pads 51a and the electrode pads 50 is longer than the separation distances between the inter-electrode pad 50 distance.

The bonding wires 53a that connect together the oscillator electrode pads 51a and the external electrodes 28S of the oscillator 28, and the bonding wires 52 that connect together the electrode pads 50 and the inner leads 38A, are formed with a 3-D intersection. Namely, as illustrated in FIG. 3, the bonding wires 52 are formed so as to straddle the bonding wires 53a. In order to prevent shorting from occurring between the bonding wires 52 and 53a, the apex of the bonding wires 53a is formed in a loop so as to be lower (less far away from the lead frame 26) than the apex of the bonding wires 52. Note that the height of the apex of the all the bonding wires 52 may be made higher than the height of the apex of the bonding wires 53a, or configuration may be made such that the height of the apex of at least each of the bonding wires 52 that form the 3-D intersection with the bonding wires 53a are made higher than the height of the apex of the bonding wires 53a.

Moreover, the center of the semiconductor chip 30 and the center CP of the rectangular shaped oscillator 28 are disposed so as be aligned substantially parallel to the X-axis direction. Namely, the width of any displacement of the center CP of the oscillator 28 from the X-axis in the Y-axis direction is narrower than the Y-axis direction width of the central portion. In this layout state, the oscillator electrode pads 51a provided in the vicinity of the center of a given side of the semiconductor chip 30 and the external electrodes 28S disposed at a distance from the two length direction ends of the oscillator 28 are connected together by the bonding wires 53a. Moreover, the electrode pads 50 are disposed in a row so as to be disposed on each side of the oscillator electrode pads 51a, and the inner leads 38A are disposed in a row along the Y-axis direction that is parallel to the electrode pads 50, are also connected together by the bonding wires 52.

Moreover, due to providing the oscillator electrode pads 51a separated from the electrode pads 50, the bonding wires 52 pass through portions where the bonding wires 53a are lower than the semiconductor chip 30. Namely, the bonding wires 52 can achieve a 3-D intersection that efficiently avoids crossing by passing in the vicinity of the apex of the bonding wires 53a. Moreover, being able to suppress the height of the apex of the bonding wires 52 enables the height of the package to also be made low.

Moreover, the connection positions of the bonding wires 53a to the external electrodes 28S of the oscillator 28 are shifted in the X-axis direction further to the inner leads 38A side than the central position of the oscillator 28. Adopting such connections enables contact of the bonding wires 53a with the edge of the semiconductor chip 30 to be reduced. Moreover, the connection positions are also shifted in the Y-axis direction more towards the direction of the oscillator 28 center than the center of the external electrodes 28S of the oscillator 28. Adopting such connections enables the number of times of cross-over with the bonding wires 52 to be reduced.

The temperature sensing device electrode pads 51b that are connected to the temperature sensing device 27 are provided separately to the electrode pads 50 on the edge of the semiconductor chip 30 on the temperature sensing device 27 side. Two of the temperature sensing device electrode pads 51b are provided above the temperature sensing device mounting beam 41 at a Y direction central portion of the semiconductor chip 30. The temperature sensing device electrode pads 51b are respectively electrically connected by bonding wires 53b to the external electrodes 27S of the temperature sensing device 27 exposed to the second main face 25B side of the die pad 26A through the through holes 26C and 26D.

The positional relationship of the electrode pads 50 to the temperature sensing device electrode pads 51b is similar to the positional relationship of the electrode pads 50 to the oscillator electrode pads 51a described above. Hence the positional relationship between the bonding wires 53b and the bonding wires 52 is also similar to the positional relationship between the bonding wires 53a and the bonding wires 52 on the oscillator 28 side. Namely, the temperature sensing device electrode pads 51b connected to the temperature sensing device 27 are provided separated from the electrode pads 50 that are provided on the same side of the semiconductor chip 30. In other words, the separation distance between the temperature sensing device electrode pads 51b and the electrode pads 50 is longer than the inter-electrode pad 50 distance.

The bonding wires 53b that connect together the temperature sensing device electrode pads 51b and the external electrodes 27S of the temperature sensing device 27, and the bonding wires 52 that connect together the electrode pads 50 and the inner leads 38A, are formed with a 3-D intersection. Namely, as illustrated in FIG. 3, the bonding wires 52 are formed so as to straddle the bonding wires 53b. In order to prevent shorting from occurring between the bonding wires 52 and 53b, the apex of the bonding wires 53b is formed as a loop so as to be lower (less far away from the lead frame 26) than the apex of the bonding wires 52.

Moreover, the center of the semiconductor chip 30 and the center of the temperature sensing device 27 are disposed so as be aligned substantially parallel to the X-axis direction.

Namely, the width of any displacement of the center of the temperature sensing device 27 from the X-axis in the Y-axis direction is narrower than the Y-axis direction width of the central portion. In this layout state, the temperature sensing device electrode pads 51b and the external electrodes 272 disposed at a distance from the two length direction ends of the temperature sensing device 27 are connected together by the bonding wires 53b. Moreover, the electrode pads 50 disposed in a row so as to be disposed on each side of the temperature sensing device electrode pads 51b, and the inner leads 38A disposed in a row along the Y-axis direction that is parallel to the electrode pads 50, are also connected together by the bonding wires 52.

Moreover, due to providing the temperature sensing device electrode pads 51b separated from the electrode pads 50, the bonding wires 52 pass through at a portion where the bonding wires 53b are lower than the semiconductor chip 30. Namely, the bonding wires 52 can achieve a 3-D intersection that efficiently avoids crossing by passing in the vicinity of the apex of the bonding wires 53b. Moreover, being able to suppress the height of the apex of the bonding wires 52 enables the height of the package to also be made low.

Moreover, the connection positions of the bonding wires 53b to the external electrodes 272 of the temperature sensing device 27 are shifted in the X-axis direction further to the inner leads 38A side than the central position of the temperature sensing device 27. Adopting such connections enables contact of the bonding wires 53b with the edge of the semiconductor chip 30 to be reduced. Moreover, the connection positions are also shifted in the Y-axis direction more towards the direction of the temperature sensing device 27 center than the center of the external electrodes 272 of the temperature sensing device 27. Adopting such connections enables the number of times of cross-over with the bonding wires 52 to be reduced.

The temperature sensing device 27, the oscillator 28, the semiconductor chip 30 and the lead frame 26 are sealed with the molding resin 32. The molding resin 32 is poured such that internal voids do not form. A distance H1 from the surface of the molding resin 32 on the temperature sensing device 27 and the oscillator 28 mounting side to the center of the inner leads 38A, is longer than a distance H2 from the surface of the molding resin 32 on the semiconductor chip 30 mounting side to the center of the inner leads 38A. In the present exemplary embodiment, the distance H1 is twice the distance H2 or greater. A distance H3 from the surface of the molding resin 32 on the semiconductor chip 30 mounting side to the center of the die pad 26A is also longer than the distance H2 from the surface of the molding resin 32 on the semiconductor chip 30 mounting side to the center of the inner leads 38A. Note that in the present exemplary embodiment a thermoset epoxy resin containing silica based filler is employed as the molding resin 32, however there is no limitation thereto, and a thermoplastic resin may for example be employed therefor.

Figure 6:
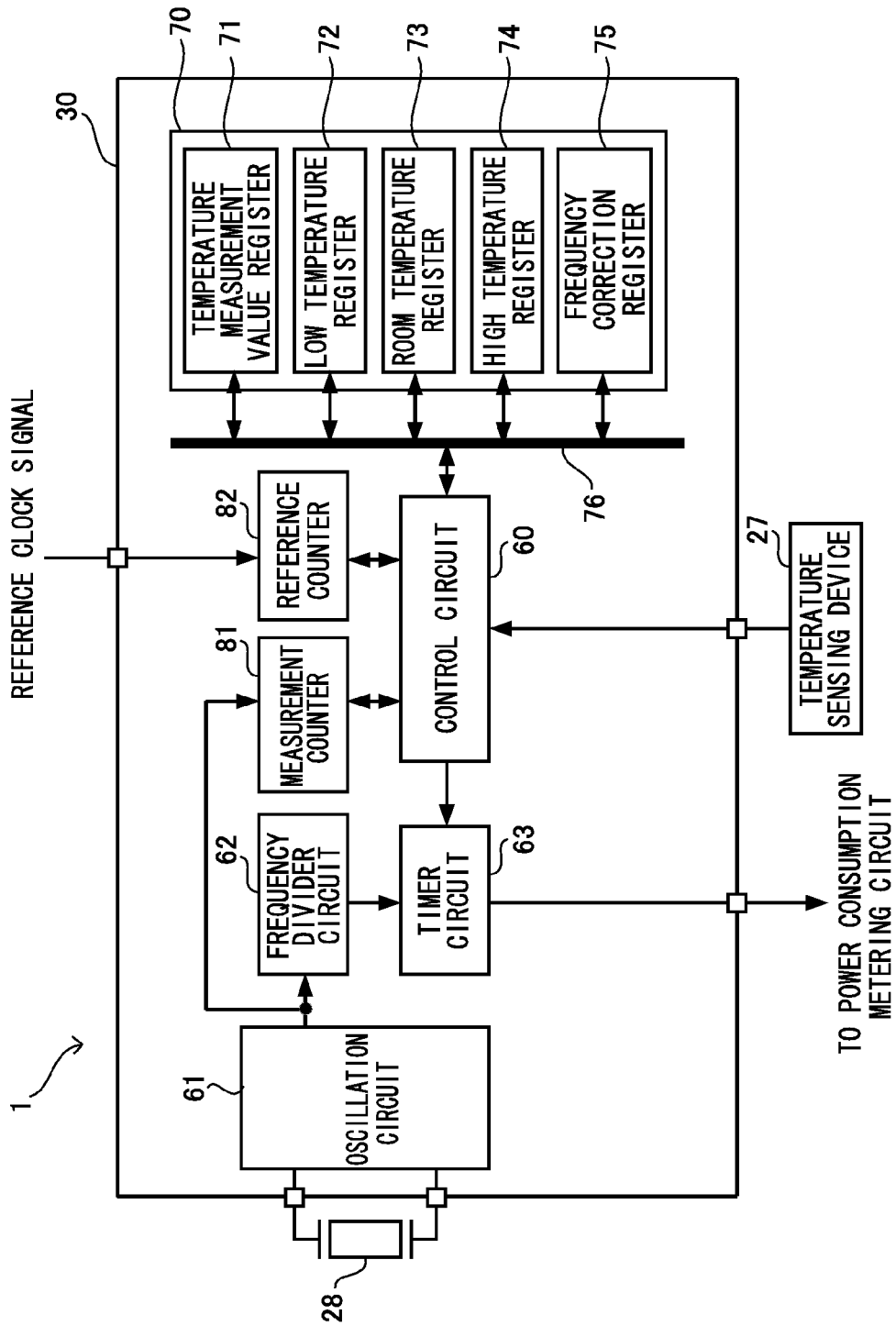
FIG. 6 is a functional block diagram of a semiconductor device according to the first exemplary embodiment of the present invention.

Explanation next follows regarding a functional configuration of the semiconductor device 1 according to the present exemplary embodiment. FIG. 6 is a functional block diagram of the semiconductor device 1 according to a first exemplary embodiment of the present invention. As illustrated in FIG. 6, the semiconductor chip 30 is in-built with an oscillation circuit 61, a frequency divider circuit 62, a timer circuit 63, a control circuit 60, a registry section 70, a measurement counter 81 and a reference counter 82.

The oscillation circuit 61 is electrically connected to the oscillator 28 by the bonding wires 53a, and includes a capacitor and an amplifier (not illustrated in the drawings), for prolonging oscillation, that together with the oscillator 28 configure the oscillating circuit. The oscillation circuit 61 generates an output signal at a frequency of 32.768 kHz. The frequency divider circuit 62 generates an output signal of for example 1 Hz by outputting at every 15th cycle of the signal output from the oscillation circuit 61. Based on a frequency correction amount supplied from the control circuit 60, the timer circuit 63 corrects frequency fluctuations in the output signal of the frequency divider circuit 62 accompanying changes in temperature, and outputs this as a timer signal. Namely, the timer signal is a 1 Hz signal with improved higher precision.

The temperature sensing device 27 is a thermistor whose resistance changes according to the peripheral temperature, as described above. The control circuit 60 is connected to the temperature sensing device 27 by the bonding wires 53b, and detects the peripheral temperature by measuring the resistance of the temperature sensing device 27. The temperature sensing device 27 is mounted on the first main face 25A of the die pad 26A so as to be alongside the oscillator 28, and so is disposed in substantially the same temperature environment as that of the oscillator 28. The temperature detected by the temperature sensing device 27 accordingly substantially matches the temperature of the oscillator 28.

The registry section 70 is configured to include plural registers 71 to 75 for storing various data for correcting frequency fluctuations of the output signals of the oscillation circuit 61 and the frequency divider circuit 62 accompanying temperature changes. Namely, the registry section 70 is configured by a temperature measurement value register 71, a low temperature register 72, a room temperature register 73, a high temperature register 74 and a frequency correction register 75. The temperature measurement value register 71 is a register that stores data indicating the temperature measured by the temperature sensing device 27. The low temperature register 72 is a register that stores data indicating, in a low temperature environment, the temperature measured by the temperature sensing device 27 and a frequency error of the output signal of the oscillation circuit 61 derived by the control circuit 60 therein. The room temperature register 73 is a register that stores data indicating, in a room temperature environment, the temperature measured by the temperature sensing device 27 and a frequency error of the output signal of the oscillation circuit 61 derived by the control circuit 60. The high temperature register 74 is a register that stores data indicating, in a high temperature environment, the temperature measured by the temperature sensing device 27 and a frequency error of the output signal of the oscillation circuit 61 derived by the control circuit 60. The frequency correction register 75 is a register that stores a frequency correction amount derived by the control circuit 60. These registers 71 to 75 are connected to the control circuit 60 through a data bus 76. The control circuit 60 writes data to and reads data from each of the registers 71 to 75 through the data bus 76.

The measurement counter 81 is a counter that counts the number of pulses of the output signal (32.768 kHz) of the oscillation circuit 61 under control from the control circuit 60. The reference counter 82 is a counter that counts the number of pulses of an externally supplied reference clock signal under control from the control circuit 60. The reference clock signal is supplied from outside through the leads 38, and is a pulse signal with high frequency precision, for example of 10 MHz. Note that although the frequency of the reference clock signal is arbitrary, it is preferably higher than the oscillation frequency (32.768 kHz) of the oscillation circuit 61. The count values of the measurement counter 81 and the reference counter 82 are supplied to the control circuit 60. The control circuit 60 derives frequency errors in the output signal of the oscillation circuit 61 based on the count values supplied from the measurement counter 81 and the reference counter 82.

The control circuit 60 is configured by a computer equipped to include a ROM stored with a data storage processing program (see FIG. 7), a frequency error derivation program (see FIG. 8) and a frequency correction processing program (see FIG. 10), as described later, a CPU for executing these programs, and RAM for temporarily storing processing content of the CPU. When executing the various programs, the control circuit 60 performs processing to write and read the derived frequency errors to and from the registry section 70, processing such as to control operation of the measurement counter 81 and the reference counter 82, and derives frequency errors based on the data stored in the registry section 70, and supplies these frequency errors to the timer circuit 63.

Data Storage Processing

Explanation follows regarding data storage processing in which the control circuit 60 of the semiconductor device 1 stores various data in the registry section 70 for deriving a frequency correction amount. The data storage processing is performed for example during shipping inspection executed prior to shipping the semiconductor device 1.

Figure 7:
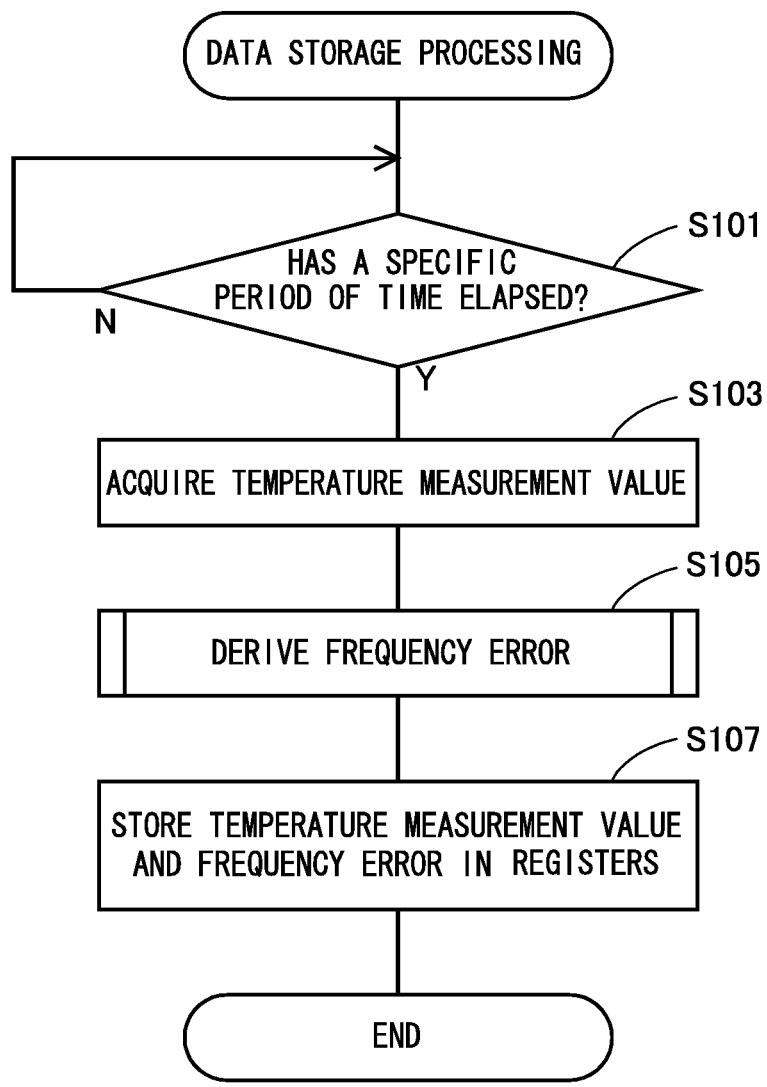
FIG. 7 is a flow chart illustrating a flow of data storage processing in the first exemplary embodiment of the present invention.

During shipping inspection, the semiconductor device 1 is first placed inside a constant temperature chamber in which the temperature set at a specific temperature. The control circuit 60 executes the data storage processing when a control signal to execute the data storage processing is externally input through the leads 38. Note that the control signal contains data indicating which temperature is set in the constant temperature chamber out of the room temperature, the high temperature and the low temperature. FIG. 7 is a flow chart illustrating a flow of processing of a data storage processing program executed by the control circuit 60. The program is pre-stored on a recording medium (ROM) of the control circuit 60.

At step S101, the control circuit 60 determines whether or not a specific period of time (for example several hours) has elapsed from when the control signal to execute the data storage processing was input. Note that the specific period of time is preferably at least a period of time required for the internal temperature of the semiconductor device 1 to reach a steady state.

If determined at step S101 that the specific period of time has elapsed, then the control circuit 60 acquires at step S103 a temperature measurement value using the temperature sensing device 27, and stores the acquired measurement value in the temperature measurement value register 71. The temperature sensing device 27 is mounted on the first main face 25A of the die pad 26A so as to be alongside the oscillator 28 and so the temperature environment is substantially the same as that of the oscillator 28. Consequently, the temperature detected by the temperature sensing device 27 is substantially the same as the temperature of the oscillator 28.

Figure 8:
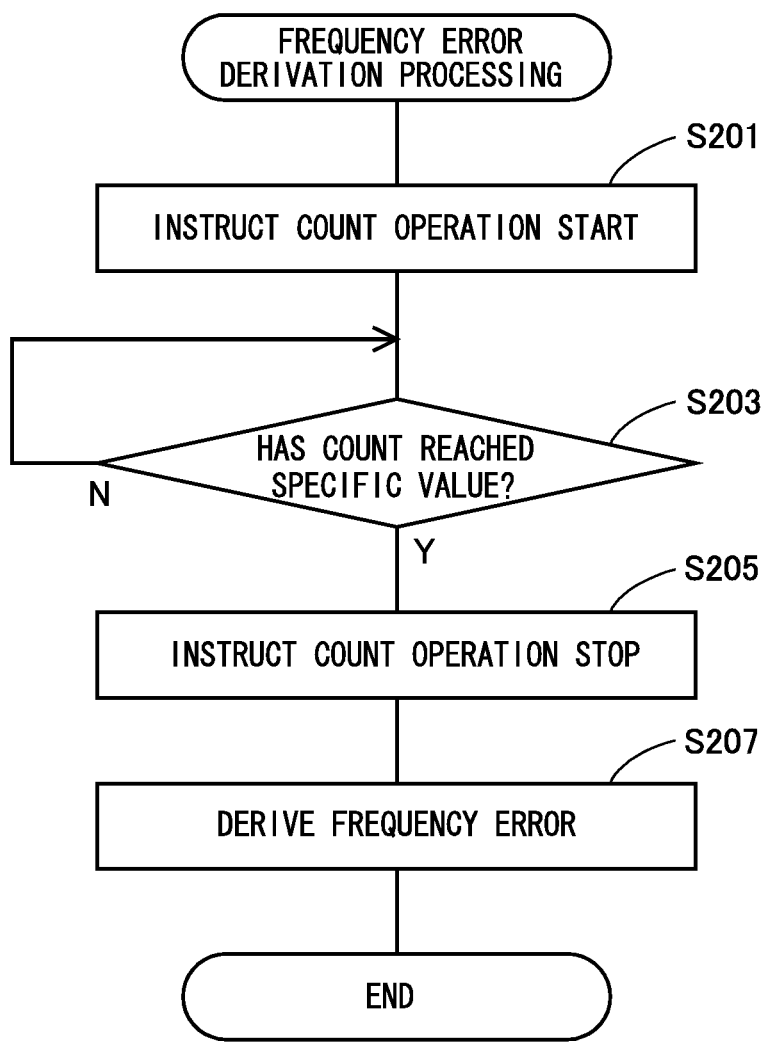
FIG. 8 is a flow chart illustrating a flow of frequency error derivation processing according to the first exemplary embodiment of the present invention.

At step S105, the control circuit 60 performs frequency error derivation processing to derive the frequency error in the output signal of the oscillation circuit 61. The frequency error in the output signal of the oscillation circuit 61 is the amount displaced from the target frequency, that is 32.768 kHz. FIG. 8 is flow chart illustrating a flow of frequency error derivation processing according to the present exemplary embodiment and corresponding to step S105. FIG. 9A and FIG. 9B are timing charts illustrating operation of the measurement counter 81 and the reference counter 82 in the frequency error derivation processing. FIG. 9A illustrates a count start time, and FIG. 9B illustrates a count stop time.

At step S201, the control circuit 60 supplies the measurement counter 81 with a control signal to start count operation. On receipt of the relevant control signal, the measurement counter 81 starts counting the number of pulses of the oscillation circuit 61 output signal, and also supplies a measurement count operation signal indicating that count operation has started to the reference counter 82. On receipt of this measurement count operation signal the reference counter 82 starts counting the number of pulses of the reference clock signal externally supplied through the leads 38. Namely, count operation is started at substantially the same time in the measurement counter 81 and the reference counter 82. In the present exemplary embodiment, the reference clock signal is a high frequency precision 10 MHz signal generated by a signal generating device, not illustrated in the drawings, and supplied to the semiconductor device 1. The count values of the measurement counter 81 and the reference counter 82 are supplied to the control circuit 60.

At step S203, the control circuit 60 determines whether or not the count value of the measurement counter 81 has reached a predetermined specific value (corresponding to 32768 counts per second in the present exemplary embodiment). The control circuit 60 continues the count operation of the measurement counter 81 and the reference counter 82 when the count value of the measurement counter 81 is determined not yet to have reached the specific value. However, when determined that the count value of the measurement counter 81 has reached the specific value, at step S205, the control circuit 60 supplies a control signal to stop the count operation to the measurement counter 81. On receipt of the relevant control signal the measurement counter 81 stops counting the number of pulses in the oscillation circuit 61 output signal and supplies a measurement count operation signal indicating that the count operation has stopped to the reference counter 82. On receipt of this measurement count operation signal, the reference counter 82 stops counting the number of pulses in the reference clock signal. Namely, the count operation is stopped at substantially the same time in the measurement counter 81 and the reference counter 82. The count values of the measurement counter 81 and the reference counter 82 are supplied to the control circuit 60.

At step S207, the control circuit 60 derives the frequency error in the output signal of the oscillation circuit 61 based on the count values of the measurement counter 81 and the reference counter 82. Namely, the control circuit 60 compares the count value of the number of pulses in the output signal of the oscillation circuit 61 (namely 32768) against the count value of the reference clock signal obtained during the same period of time, and thereby derives the frequency error of the output signal of the oscillation circuit 61. In the present exemplary embodiment, the frequency of the reference clock signal is 10 MHz and so if the count value of the reference counter 82 is 10000000 (in decimal numbering) then 1 second can be accurately timed by the output signal of the oscillation circuit 61. Consequently, in this case, the frequency error of the oscillation circuit 61 would be 0, and there would be a frequency correction amount of 0. However, for example, if for example the count value of the reference counter 82 is 10000002 (in decimal numbering)

then it can be estimated that the frequency of the output signal of the oscillation circuit 61 is slow by 0.2 ppm (parts per million). Thus in such a case the frequency of the output signal of the oscillation circuit 61 needs to be corrected by this error amount, namely sped up by 0.2 ppm. Namely the frequency correction amount is +0.2 ppm. Moreover, if for example the count value of the reference counter 82 is 9999990 (in decimal numbering) then the frequency of the output signal of the oscillation circuit 61 can be estimated to be fast by 1.0 ppm. The frequency of the output signal of the oscillation circuit 61 accordingly needs to be corrected by this error amount, namely slowed by 1.0 ppm. Namely, the frequency correction amount is −1.0 ppm. The frequency error derivation processing is completed through the above processing.

When the frequency error derivation processing is completed, then at step S107 (see FIG. 7), the control circuit 60 associates the temperature measurement value acquired at step S103 with the frequency error derived at step 207, and stores these values in the room temperature register 73 when the temperature set for the constant temperature chamber is room temperature, stores these values in the high temperature register 74 when the temperature set in the constant temperature chamber is a high temperature, and stores these values in the low temperature register 72 when the temperature set in the constant temperature chamber is a low temperature.

The semiconductor device 1 is sequentially placed in the constant temperature chamber set with each of the temperatures, the low temperature, room temperature or the high temperature, set as the temperature in the chamber, and the data storage processing program described above is repeatedly executed. So doing results in the low temperature register 72, the room temperature register 73 and the high temperature register 74 being stored with the temperature measurement values and the frequency errors of the oscillation circuit 61 in each of the temperature environment conditions.

Frequency Correction Processing

Explanation next follows regarding frequency correction processing in the semiconductor device 1 after the above data storage processing has been completed. The frequency correction processing is processing performed to correct the frequency error arising in the output signals of the oscillation circuit 61 and the frequency divider circuit 62 caused by the frequency temperature characteristics of the oscillator 28.

Figure 10:
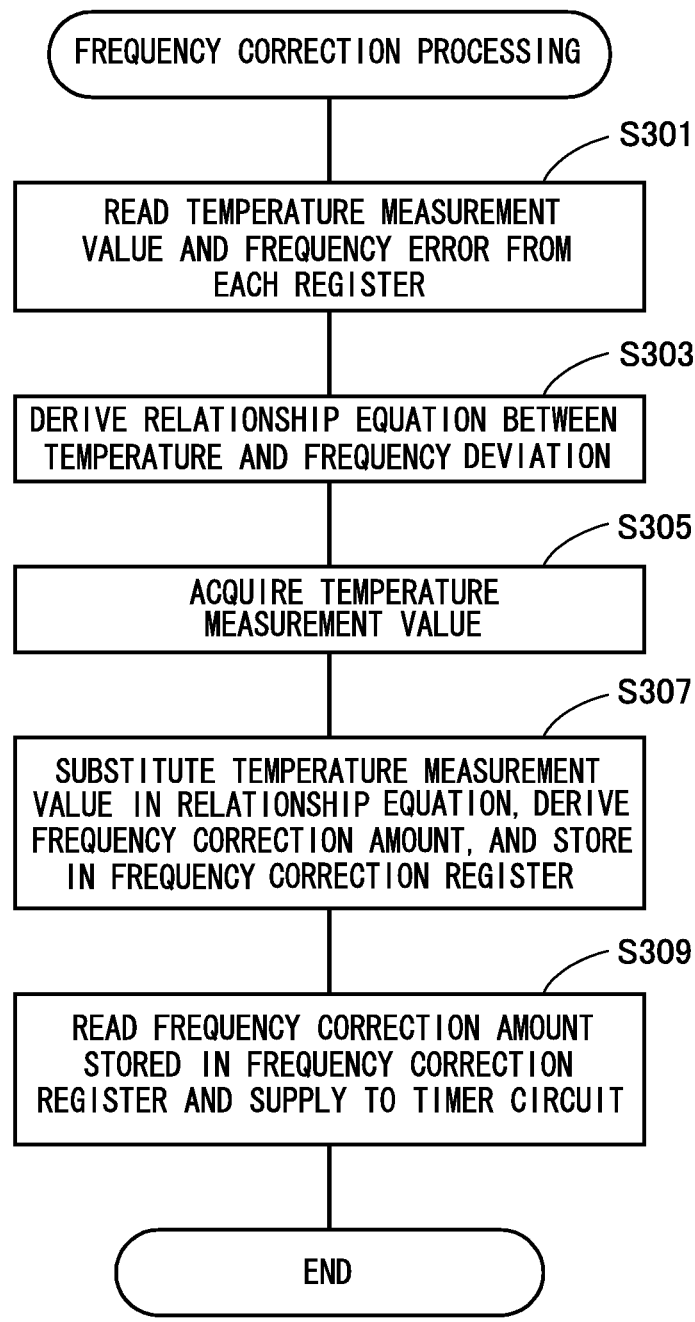
FIG. 10 is a flow chart illustrating a flow of frequency correction processing according to the first exemplary embodiment of the present invention.

In a state installed in the integrating electricity meter 10 (see FIG. 1), the control circuit 60 executes the frequency correction processing program every specific period of time, or during system reset and in response to input of a control signal through the leads 38. FIG. 10 is a flow chart illustrating a flow of processing of a frequency correction processing program executed in the control circuit 60. This program is pre-stored on a storage unit of the control circuit 60.

At step S301, the control circuit 60 reads the temperature measurement values and the frequency errors stored in the low temperature register 72, the room temperature register 73, and the high temperature register 74.

Figure 11:
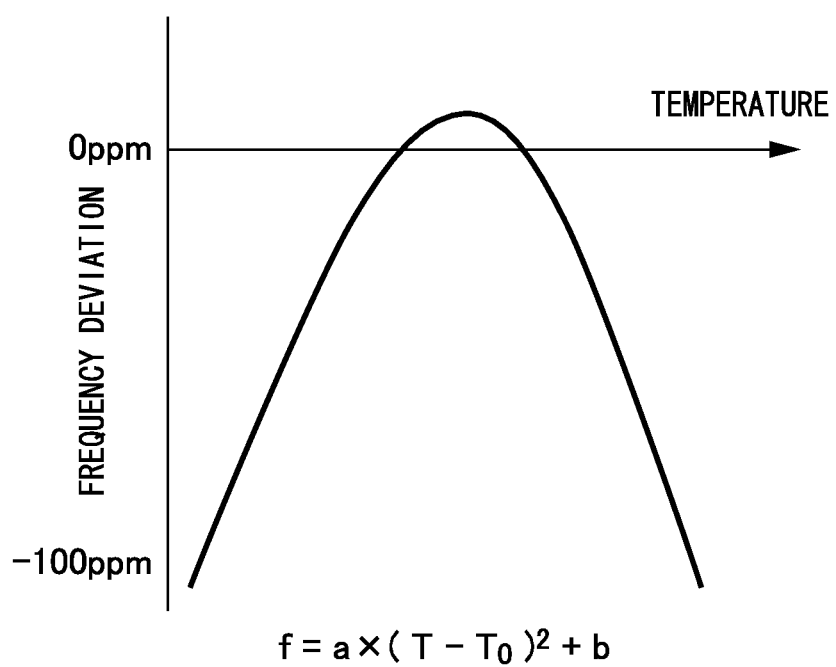
FIG. 11 illustrates a relationship between temperature and frequency deviation in an oscillation circuit.

At step S303, the control circuit 60 derives a relationship equation (frequency-temperature characteristics) between temperature and frequency error in the oscillation circuit 61 based on the temperatures and frequency errors read at step S301. FIG. 11 illustrates a graph of the relationship between temperature and frequency error (namely frequency-temperature characteristics) in an ordinary oscillation circuit containing a tuning fork shaped quartz crystal oscillator. The graph illustrated in FIG. 11 is expressed by the following Equation (1). Note that in Equation (1), the f is the frequency deviation, a is a quadratic temperature coefficient, T is the measured temperature, T0 is a vertex temperature, and b is a vertex error.

$$f = a \times (T - T_0)^2 + b \tag{1}$$

wherein in Equation (1), a, T0 and b are constants determined according to the oscillator employed. These values fluctuate due to individual variation between oscillators. It is accordingly possible to accurately derive the frequency-temperature characteristics of the oscillation circuit 61 by deriving a, T0 and b based on measured values. The control circuit 60 derives the values of the a, T0 and b by substituting the frequency errors and the temperature measurement values read from each of the registers 72 to 74 as f and T in Equation (1), and thereby derives the relationship equation between temperature and frequency deviation (the frequency-temperature characteristics) of the oscillation circuit 61.

At step S305, the control circuit 60 acquires the temperature measurement value by the temperature sensing device 27, and stores the acquired temperature measurement value in the temperature measurement value register 71.

At step S307, by substituting the temperature measurement value stored in the temperature measurement value register 71 into the relationship equation derived at step S303, the control circuit 60 derives as the frequency correction amount the frequency deviation at that temperature. The control circuit 60 then stores the frequency correction amount in the frequency correction register 75.

At step S309, the control circuit 60 supplies the timer circuit 63 with correction data indicating the frequency correction amount stored in the frequency correction register 75, thereby completing the current routine. The timer circuit 63 generates a timer signal of the frequency of the output signal of the frequency divider circuit 62 corrected based on the correction data supplied from the control circuit 60, and supplies the timer signal to the later-stage power consumption metering circuit 22 (see FIG. 1).

Thus in the semiconductor device 1 of the present exemplary embodiment, the frequency errors in the oscillation circuit 61 in each of the temperature environments, room temperature, low temperature, high temperature are derived by actual measurements made on product shipment, and the frequency errors are stored together with the temperature measurement values in the registry section 70. Then after product shipment, a frequency correction amount is derived from the relationship equation between the temperature and the frequency error of the oscillation circuit 61 derived based on the data stored in the registry section 70, and the frequency change component of the oscillation circuit 61 due to temperature change is corrected according to the derived frequency correction amount, and a high precision timing signal generated.

As is clear from the above explanation, in the semiconductor device 1 according to the first exemplary embodiment of the present invention, the temperature sensing device 27, the oscillator 28 and the semiconductor chip 30 are sealed as a unit with the molding resin 32, and the semiconductor chip 30 is in-built with the oscillation circuit 61, the frequency divider circuit 62 and the timer circuit 63. Accordingly, the time can be measured with only the semiconductor device 1 mounted to the base board in the integrating electricity meter 10 illustrated in FIG. 1. Namely, there is no need to separately mount the oscillator 28 and the frequency divider circuit 62 etc. to the base board. A saving is accordingly made in effort for connecting and adjusting between the oscillator and the frequency divider circuit.

Moreover, the temperature sensing device 27 is a discrete component as a separate body to the semiconductor chip 30, and so in comparison to a temperature sensing device built into the semiconductor chip 30, the effects of heat generated by the semiconductor chip 30 on the temperature measurement values can be reduced. Moreover, making the temperature sensing device 27 a separate body to the semiconductor chip 30 enables a temperature sensing device with desired characteristics to be selected. For example, it is possible to use a thermistor as the temperature sensing device 27. Although there are thermistors that have a large change in resistance with temperature changes and small variation are available, an improvement in temperature detection precision can still be achieved in comparison to a temperature sensing device in-built into the semiconductor chip 30.

Moreover, since the temperature sensing device 27 and the oscillator 28 are alongside each other on the first main face 25A of the die pad 26A, the temperature environments of the temperature sensing device 27 and the oscillator 28 can be made to match each other. It thereby becomes possible to accurately measure the temperature of the oscillator 28 using the temperature sensing device 27, enabling accurate correction to be made of the frequency error the oscillation circuit 61 caused by the temperature characteristics of the oscillator 28. Moreover, in the present exemplary embodiment described above, the resistor 271 configuring the temperature sensing device 27 is configured directly connected to the die pad 26A. However, so as to achieve a similar configuration to that of the oscillator 28, configuration may be made with a resistor 271 with external terminals sealed in a vacuum inside a vacuum container (not illustrated in the drawings), and with the vacuum container connected to the die pad 26A. The temperature environment of the resistor 271 can thereby be made to even more closely approach the temperature environment of the quartz vibrating reed 281, and even more accurate frequency correction can be performed.

Moreover, the temperature sensing device 27 and the oscillator 28 are disposed so as to partially overlap with the semiconductor chip 30 mounted on the opposite side of the die pad 26A in a direction parallel to the first and second main faces, and so the package size can be made smaller than in cases in which these member are all disposed side by side on the same face of the die pad 26A.

Moreover, the external electrodes 272 of the temperature sensing device 27 and the external electrodes 285 of the oscillator 28 are exposed through the through holes 26C to 26F to the second main face 25B side of the die pad 26A mounted with the semiconductor chip 30. This thereby enables connection of the semiconductor chip 30 to the temperature sensing device 27 and the oscillator 28 to be made using the bonding wires 53a, 53b without having to invert the lead frame 26 even though the components are mounted on both faces of the lead frame 26. Moreover, according to such a configuration, the length of the bonding wires 53a, 53b connecting the semiconductor chip 30 to the temperature sensing device 27 and the oscillator 28 can be made the minimum length. The wiring resistance can thereby be reduced, enabling a configuration less readily affected by noise. Moreover, even though noise is readily generated between the bonding wires 52 that extend parallel to each other, a 3-D intersection is achieved of the bonding wires 52 for connecting together the temperature sensing device 27 and the semiconductor chip 30 with respect to the bonding wires 53a for connecting together the oscillator 28 and the semiconductor chip 30 and the bonding wires 53b for connecting together the temperature sensing device 27 and the semiconductor chip 30. The accordingly enables the influence of noise to be reduced. Moreover, the temperature sensing device 27 and the oscillator 28 are closely adhered to the first main face 25A of the die pad 26A, and so the capillary can be prevented from contacting edge portions of the through holes 26C to 26F during wire bonding.

Moreover, in the semiconductor device 1 according to the first exemplary embodiment of the present invention, the control circuit 60 stores the frequency errors of the oscillation circuit 61 from measurements at plural temperature environments, these being low temperature, room temperature and high temperature, in each of the registers 72 to 74, and derives the frequency-temperature characteristics of the oscillation circuit 61 based on the stored frequency errors. Thus the control circuit 60 derives the frequency-temperature characteristics for each different oscillator by actual measurements, enabling accurate frequency-temperature characteristics to be acquired. Moreover, the control circuit 60 derives the frequency correction amount based on the derived frequency-temperature characteristics, and the timer circuit 63 generates the timer signal in which the frequency of the output signal of the frequency divider circuit 62 has been corrected based on this frequency correction amount, thereby enabling more accurate time measurements to be performed.

Note that an explanation has been given in the above exemplary embodiments of an example in which the relationship equation between the temperature and the frequency deviation of the oscillation circuit 61 is derived in the frequency correction processing (see FIG. 10), however configuration may be made such that the relationship equation is determined during data storage processing performed prior to product shipment, and the derived relationship equation or the a, T0 and b stored in a register.

Second Exemplary Embodiment

Figure 12A:
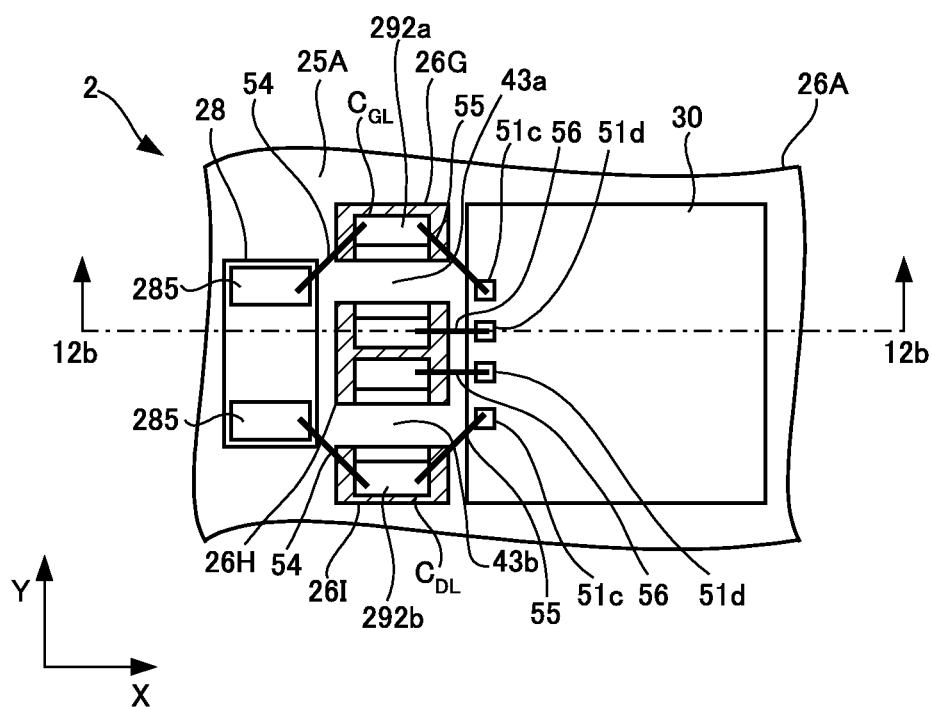
FIG. 12A is a plan view illustrating a configuration of a semiconductor device according to a second exemplary embodiment of the present invention.
Figure 12B:
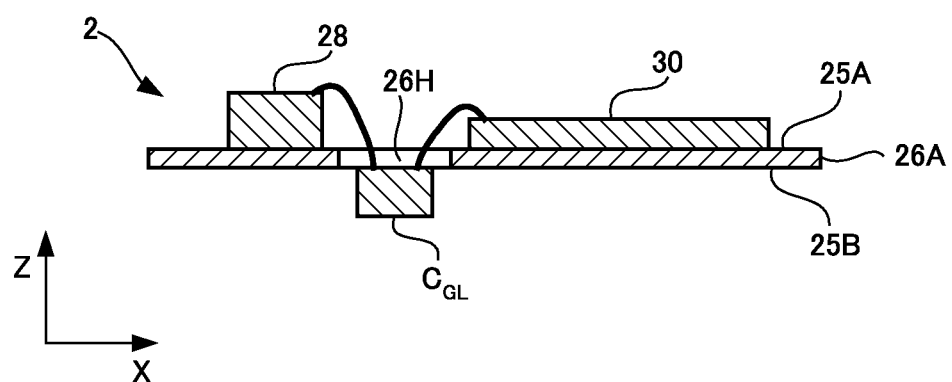
FIG. 12B is cross-section taken on 12b-12b of FIG. 12A.
Figure 13:
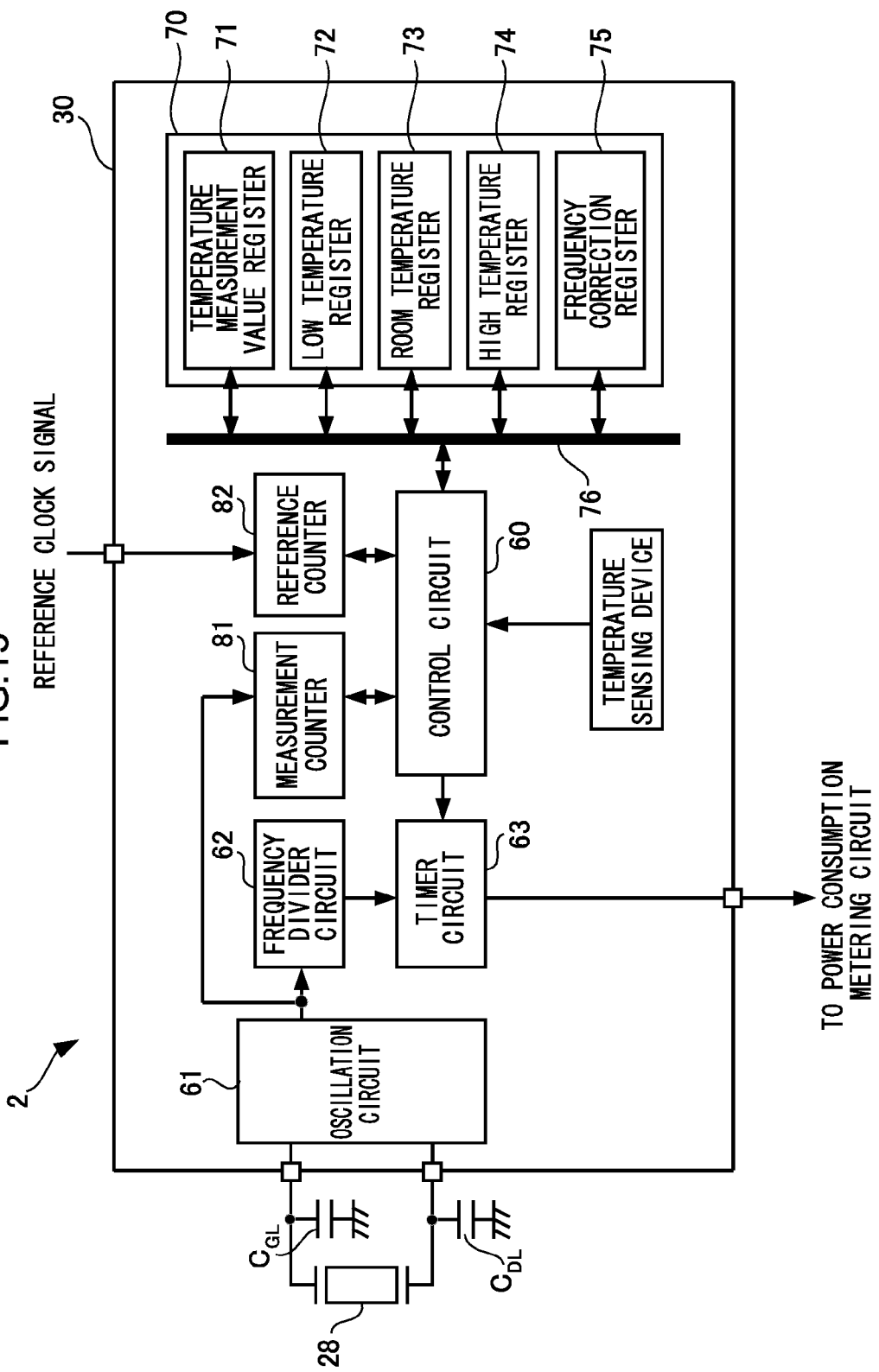
FIG. 13 is a functional block diagram of a semiconductor device according to a second exemplary embodiment of the present invention.

Explanation follows regarding a semiconductor device according to a second exemplary embodiment of the present invention. FIG. 12A is a plan view illustrating a configuration of a semiconductor device 2 according to a second exemplary embodiment of the present invention, and FIG. 12B is a cross-sectional diagram taken on line 12b-12b in FIG. 12A. Note that in FIG. 12A and FIG. 12B, only the configuration on a die pad 26A is selected for illustration, and leads 38, electrode pads 50, bonding wires 52 connecting together the leads 38 and the electrode pads 50, and molding resin 32 as illustrated in FIG. 2 and FIG. 3 are omitted from illustration. FIG. 13 is a block diagram illustrating a schematic configuration of the semiconductor device 2 according to the present exemplary embodiment.

The semiconductor device 2 according to the present exemplary embodiment is configured including a semiconductor chip 30 and an oscillator 28 mounted on a first main face 25A of the die pad 26A, and capacitors CGL and CDL mounted on the second main face 25B are included. Namely, the capacitors CGL and CDL are in-built into the semiconductor chip 30 and the oscillation circuit 61 of the first exemplary embodiment, however in the present exemplary embodiment, the capacitors CGL and CDL are separate from the semiconductor chip 30 and mounted on the second main face 25B of the die pad 26A. The capacitors CGL and CDL configure an oscillation circuit together with the oscillator 28. Note that in the present exemplary embodiment a temperature sensing device (temperature sensor) is in-built into the semiconductor chip 30.

There are through holes 26G, 26H, 26I formed in the die pad 26A through from the first main face 25A to the second main face 25B. These through holes 26G to 26I are respectively formed with rectangular shapes, and are arrayed along the Y direction. The semiconductor chip 30 and the oscillator 28 are disposed on the first main face 25A of the die pad 26A alongside each other in the X direction in a state interposed between the respective through holes 26G to 26I.

A region between the through holes 26G and 26H on the second main face 25B of the die pad 26A configures a first capacitor mounting beam 43a that serves as a first capacitor mounting region for mounting the capacitor CGL. Similarly, a region between the through holes 26H and 26I configures a second capacitor mounting beam 43b that serves as a second capacitor mounting region for mounting the capacitor CDL. The capacitor CGL is joined on the second main face 25B side of the die pad 26A to the first capacitor mounting beam 43a formed between the through holes 26G and 26H. The capacitor CDL is joined on the second main face 25B side of the die pad 26A to the second capacitor mounting beam 43b formed between the through holes 26H and 26I.

Figure 14:
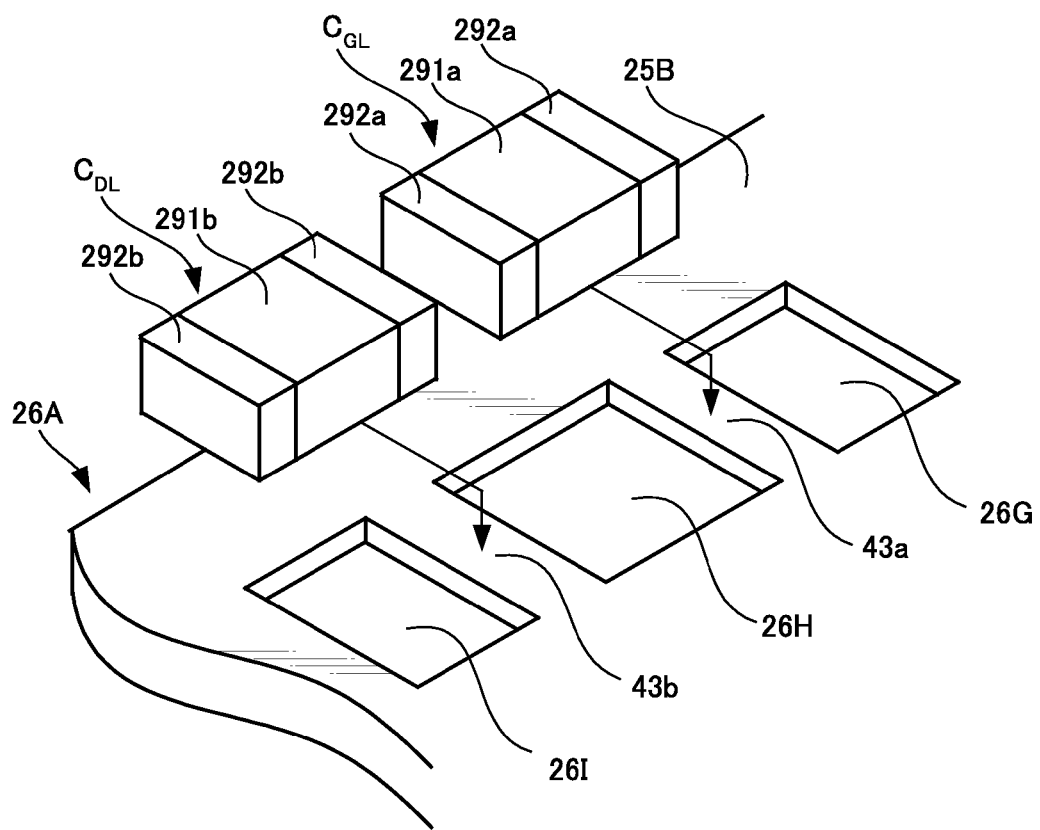
FIG. 14 is a perspective view illustrating a configuration of a capacitor according to the second exemplary embodiment of the present invention.

FIG. 14 is a perspective view illustrating a configuration of the capacitors CGL and CDL. Note that in FIG. 14, the through holes 26G, 26H, 26I formed to the die pad 26A and the capacitor mounting beams 43a, 43b are illustrated together with the capacitors CGL and CDL. The capacitors CGL and CDL are surface mounted type ceramic chip capacitors, and are configured to respectively include ceramic dielectric bodies 291a, 291b, and external terminals 292a, 292b provide at the two ends of each of the ceramic dielectric bodies.

The capacitor CGL is joined to the second main face 25B of the die pad 26A so as to straddle the first capacitor mounting beam 43a. The two external terminals 292a formed at the two ends of the ceramic dielectric body 291a are accordingly respectively exposed to the first main face 25A side of the die pad 26A through the through holes 26G and 26H. Similarly, the capacitor CDL is joined to the second main face 25B of the die pad 26A so as to straddle the second capacitor mounting beam 43b. The two external terminals 292b formed to the two ends of the ceramic dielectric body 291b are also accordingly exposed to the first main face 25A side of the die pad 26A through the through holes 26H and 26I.

The oscillator 28 is mounted to the first main face 25A of the die pad 26A such that external terminals 285 face upwards. One external terminal 292a of the capacitor CGL that is exposed to the first main face 25A side through the through hole 26G is connected through a bonding wire 54 to one of the external terminals 285 of the oscillator 28, and also connected through a bonding wire 55 to an electrode pad 51C of the semiconductor chip 30. Namely, the oscillator 28 and the semiconductor chip 30 are electrically connected together through one of the external terminals 292a of the capacitor CGL that is exposed to the first main face 25A side through the through hole 26G. Similarly, one of the external terminals 292b of the capacitor CDL that is exposed to the first main face 25A through the through hole 26I is connected to the other of the external terminals 285 of the oscillator 28 through the bonding wire 54, and connected to an electrode pad 51c of the semiconductor chip 30 through the bonding wire 55. Namely, the oscillator 28 and the semiconductor chip 30 are electrically connected together through one of the external terminals 292b of the capacitor CDL that is exposed to the first main face 25A through the through hole 26I. The other external terminals 292a, 292b of the capacitors CGL and CDL that are exposed to the first main face 25A side through the central through hole 26H are connected to an electrode pad 51d of the semiconductor chip 30 through a bonding wire 56. The electrical potential of the electrode pad 51d is fixed to ground level. The ground electrical potential is accordingly applied to the other external terminals 292a, 292b of the capacitors CGL and CDL. Note that similarly to with the semiconductor device 1 according to the first exemplary embodiment, the semiconductor device 2 according to the present exemplary embodiment executes data storage processing and frequency correction processing, and high precision is secured in the frequency of the timing signal output from the timer circuit 63 in the semiconductor chip 30.

The capacitors CGL and CDL in the present exemplary embodiment are components discrete from the semiconductor chip 30, thereby enabling the surface area of the semiconductor chip 30 to be made smaller in comparison to when the capacitors CGL and CDL are in-built into the semiconductor chip 30, and enabling the manufacturing cost to be suppressed. Moreover, making the capacitors CGL and CDL separate from the semiconductor chip 30 enables capacitors of desired characteristics to be selected.

Figure 15:
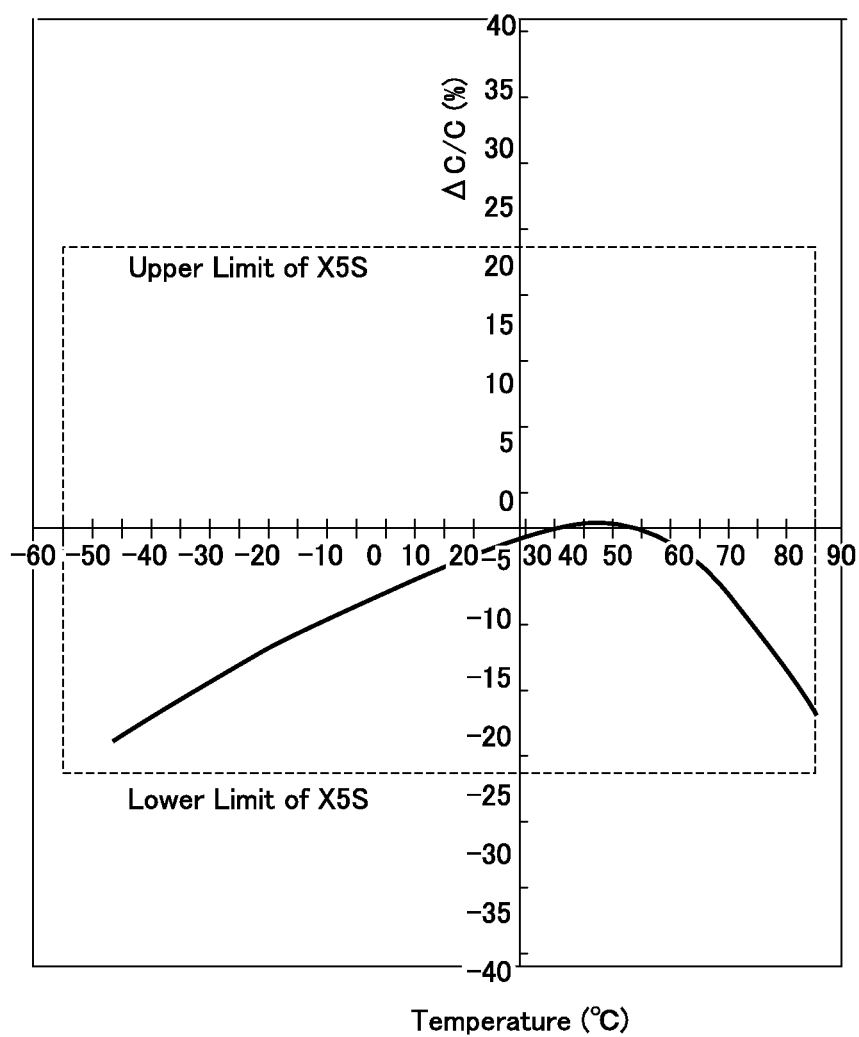
FIG. 15 is a graph illustrating temperature characteristics of a capacitor according to a second exemplary embodiment of the present invention.

A tuning fork shaped quartz crystal oscillator, as illustrated in FIG. 11, exhibits frequency-temperature characteristics such that the oscillation frequency in a low temperature region and a high temperature region is lower than that in a room temperature region. However, it is known that in the oscillation frequency of an ordinary oscillation circuit, the oscillation frequency becomes higher when the load capacitance is small. For example when a capacitor with temperature characteristics such that the capacitance value in a low temperature region and a high temperature region is smaller than the capacitance value in a room temperature region, as illustrated in FIG. 15, is incorporated in an oscillation circuit, it is possible to employ the temperature characteristics of the capacitors to cancel out the lowered portions of the oscillation frequency in the low temperature region and the high temperature region caused by the temperature characteristics of the oscillator, enabling the frequency-temperature characteristics in the oscillation circuit 61 to be made flat. For example, in a case in which a capacitor of about 10 pF is employed that has a capacitance value that is about 20% lower in the high temperature region and the low temperature region, then a cancelling out effect is expected in the high temperature region and the low temperature region on the temperature characteristics of about 10 ppm to 60 ppm. Flattening the frequency-temperature characteristics of the oscillation circuit 61 is important in frequency error correction processing. Namely, in the semiconductor device 2 according to the present exemplary embodiment, similarly to in the first exemplary embodiment, the temperature and the frequency error of the oscillation circuit 61 is measured in each of the temperature environments of room temperature, low temperature and high temperature. When this is performed, if there are large frequency fluctuations with respect to temperature changes then frequency errors arising due to slight errors in temperature measurement cannot be ignored. It is possible to raise the precision of frequency correction by flattening the frequency-temperature characteristics of the oscillation circuit 61. For a capacitor with temperature characteristics as illustrated in FIG. 15, barium titanate may for example be employed to give a laminated ceramic capacitor with X5S characteristics as a dielectric body.

Moreover, the external terminals 292a of the capacitor CGL and the external terminals 292b of the capacitor CDL are exposed through the through holes 26G to 26I to the first main face 25A side of the die pad 26A where the semiconductor chip 30 and the oscillator 28 are mounted. This accordingly enables the capacitors CGL and CDL to be connected to the oscillator 28 and the semiconductor chip 30 by the bonding wires 54, 55, 56 without having to invert the lead frame. Moreover, the oscillator 28 and the semiconductor chip 30 are disposed so as to be interposed between through holes 26G to 26I, thereby enabling the length of each of the bonding wires 54, 55, 56 to be made a minimum length. The wiring resistance can be reduced thereby, enabling a configuration that is not readily affected by noise. The capacitors CGL and CDL are closely adhered to the second main face 25B side of the die pad 26A, and so the capillary can be prevented from making contact with the edge portion of the through holes 26G to 26I during wire bonding.

Moreover, the oscillator 28 and the semiconductor chip 30 use the external terminals 292a, 292b of the capacitors CGL and CDL exposed through the through holes 26G and 26I as relay points during wire bonding. The vertex point of the bonding wires 53, 55 can accordingly be set lower than in cases in which the oscillator 28 and the semiconductor chip 30 are connected directly by bonding wires on the same face of the die pad 26A. The thickness of the packaging of the semiconductor device 2 can accordingly be made thinner.

Figure 16:
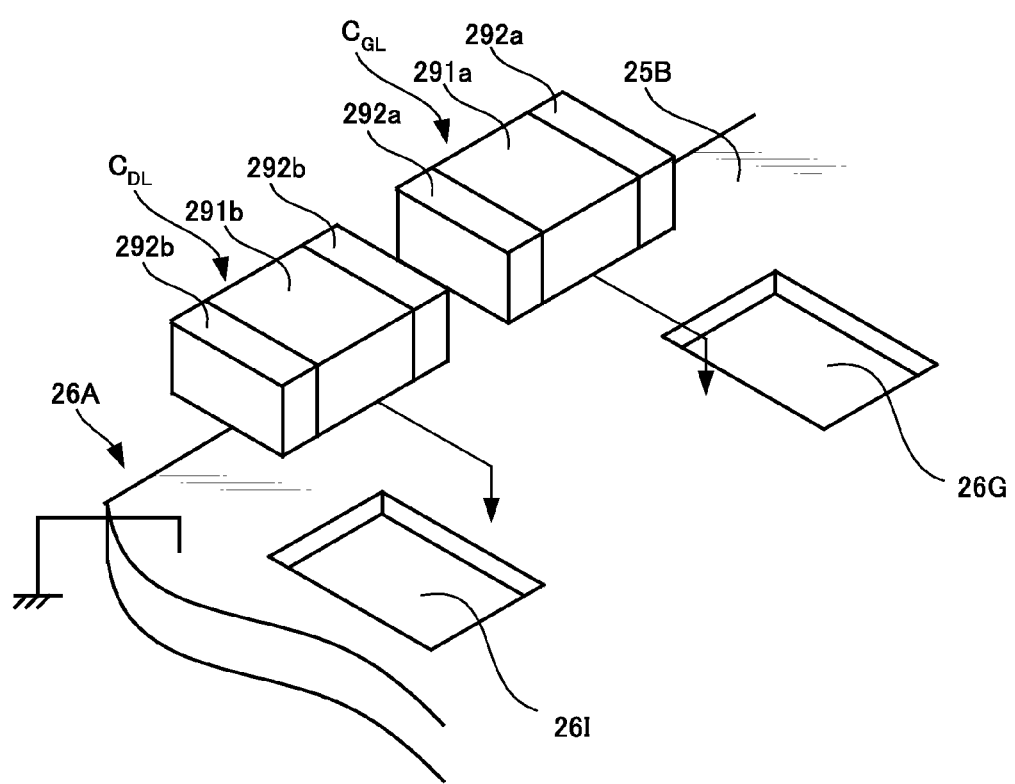
FIG. 16 is a perspective view illustrating a partial configuration of a semiconductor device according to a second exemplary embodiment of the present invention.

Moreover, in the present exemplary embodiment, the external terminals 292a, 292b of the capacitors CGL and CDL that are exposed to the first main face 25A side of the die pad 26A through the central through hole 26H are connected through the bonding wires 56 to the electrode pad 51d of the semiconductor chip 30 that is fixed to ground electrical potential. As an alternative to such a configuration, as illustrated in FIG. 16, configuration may be made with the central through hole 26H eliminated, and one of the external terminals 292a, 292b of the capacitors CGL and CDL may be connected to the die pad 26A with a conductive bonding material such as solder, so that the die pad 26A is fixed to the ground electrical potential. Adopting such a configuration enables the number of bonding wires to be reduced, and enables the possibility of shorting between wires to be reduced.

Third Exemplary Embodiment

Figure 17A:
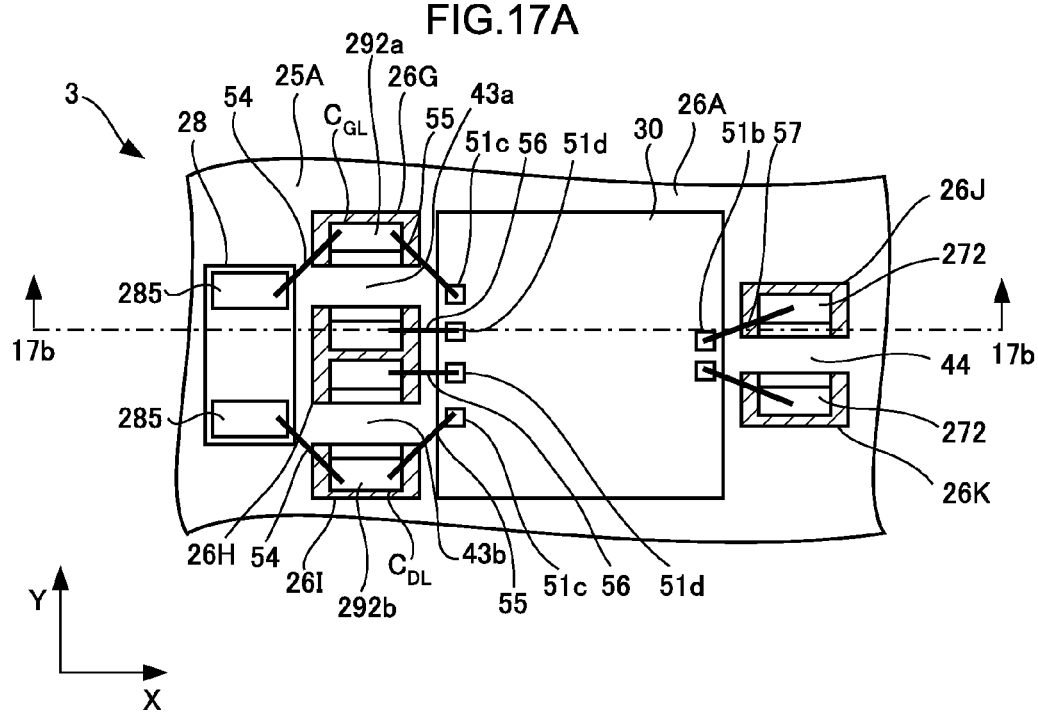
FIG. 17A is a plan view illustrating a configuration of a semiconductor device according to a third exemplary embodiment of the present invention.
Figure 17B:
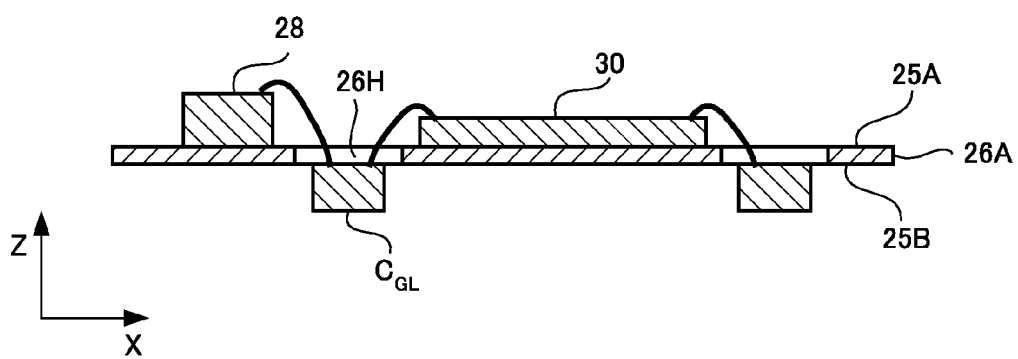
FIG. 17B is a cross-section taken on line 17b-17b in FIG. 17A.
Figure 18:
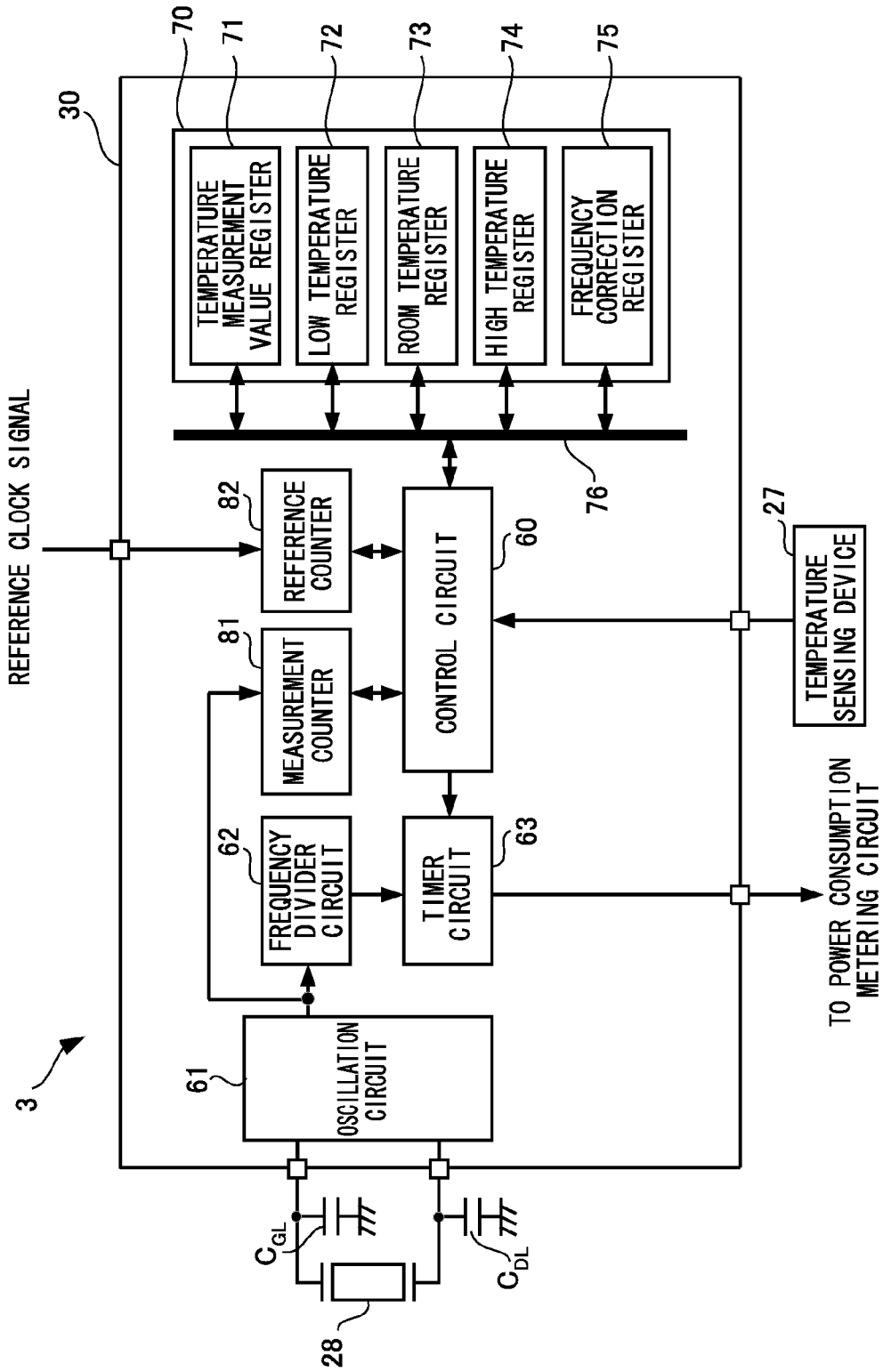
FIG. 18 is a functional block diagram illustrating a semiconductor device according to the third exemplary embodiment of the present invention.

Explanation follows regarding a semiconductor device according to a third exemplary embodiment of the present invention. FIG. 17A is a plan view illustrating a configuration of a semiconductor device 3 according to the third exemplary embodiment of the present invention, and FIG. 17B is a cross-section taken along line 17b-17b of FIG. 17A. Note that in FIG. 17, only the configuration on the die pad 26A is selected for illustration, and leads 38, electrode pads 50, bonding wires 52 connecting together the leads 38 and the electrode pads 50, and molding resin 32 as illustrated in FIG. 2 and FIG. 3 are omitted from illustration. FIG. 18 is a block diagram illustrating a schematic configuration of the semiconductor device 3.

The semiconductor device 3 according to the third exemplary embodiment differs from the semiconductor device 2 according to the second exemplary embodiment in that, in addition to the capacitors CGL and CDL, a temperature sensing device 27 is mounted on a second main face 25B side of the die pad 26A as a discrete separated body to the semiconductor chip 30. Explanation follows regarding differences between the semiconductor device 3 according to the present exemplary embodiment and the semiconductor device 2 according to the second exemplary embodiment.

Through holes 26J and 26K are formed in the die pad 26A so as to pass through from the first main face 25A to the second main face 25B. These through holes 26J and 26K are arrayed along the Y direction. The through holes 26J and 26K are provided close together on a side facing towards the side of the semiconductor chip 30 on which the through holes 26G to 26I are provided. Namely, the semiconductor chip 30 is provided between the through holes 26G to 26I and the through holes 26J and 26K.

A region between the through holes 26J and 26K on the second main face 25B of the die pad 26A configures a temperature sensing mounting beam 44 serving as a temperature sensing device mounting region for mounting the temperature sensing device 27. The temperature sensing device 27 is a surface mounted type of thermistor and is configured with a resistor and external terminals 272 provided at the two ends of the resistor. The temperature sensing device 27 is joined to the second main face 25B of the die pad 26A so as to straddle the temperature sensing mounting beam 44. The two external terminals 272 formed to the two ends of the temperature sensing device 27 are respectively exposed to the first main face 25A side of the die pad 26A through the through holes 26J and 26K.

The external terminals 272 of the temperature sensing device 27 exposed to the first main face 25A side through the through holes 26J and 26K are connected to temperature sensing device electrode pads 51b of the semiconductor chip 30 through bonding wires 57. Note that, similarly to in the semiconductor device 1 of the first exemplary embodiment described above, data storage processing and frequency correction processing is executed in the semiconductor device 3 according to the present exemplary embodiment, and high precision is secured in the frequency of the timing signal output from a timer circuit in the semiconductor chip 30.

Thus in the semiconductor device 3 according to the present exemplary embodiment, the semiconductor chip 30 and the oscillator 28 are disposed on the first main face 25A of the die pad 26A alongside each other in the X direction, and the capacitors CGL, CDL are disposed on the second main face 25B of the die pad 26A alongside each other in the X direction, with the semiconductor chip 30 interposed between the capacitors CGL and CDL and the temperature sensing device 27. Both the capacitors CGL, CDL and the temperature sensing device 27 are configured as discrete components separate to the semiconductor chip 30, such that more suitable components can be selected, and enabling the time measurement precision to be further raised. Moreover, according to the third exemplary embodiment of the present exemplary embodiment, it is possible to perform wire bonding without inverting the lead frame, similarly to in the first and second exemplary embodiments. Moreover, in the present exemplary embodiment, placement of each of the component is determined such that the distance between the oscillator 28 and the temperature sensing device 27 is comparatively long. In other words, placement of each of the component is determined such that the distance between the oscillator 28 and the temperature sensing device 27 is longer than the distance between the oscillator 28 and the semiconductor chip 30. This thereby enables the influence on the temperature sensing device 27 of noise arising from the oscillator 28 to the made smaller. Moreover, preferably the die pad 26A is fixed at the ground electrical potential in order to prevent any noise arising from the oscillator 28 being transmitted through the lead frame to the temperature sensing device 27. Moreover, placement may be made such that the semiconductor chip 30 is mounted on the first main face 25A of the die pad 26A and the capacitors CGL, CDL and the temperature sensing device 27 are mounted on the second main face 25B of the die pad 26A so as to partially overlap with each other in a direction parallel to the first and second main faces. This thereby enables a more compact package size to be achieved.

Fourth Exemplary Embodiment

Explanation follows regarding a semiconductor device according to a fourth exemplary embodiment of the present invention. In the semiconductor device according to the first to the third exemplary embodiments, the frequency correction processing is executed every specific cycle, and derivation is performed of a frequency correction amount according to the peripheral temperature at each time of the frequency correction processing. In contrast thereto, in the semiconductor device according to the present exemplary embodiment, processing is simplified such that a new frequency correction amount is only derived when a change amount from the temperature measured at the previous time of frequency correction processing execution is a specific value or greater. When the change amount from the temperature measured at the previous time of frequency correction processing execution is less than the specific value, the frequency correction amount derived when the previous frequency correction processing was performed is employed to perform frequency correction processing.

Figure 19:
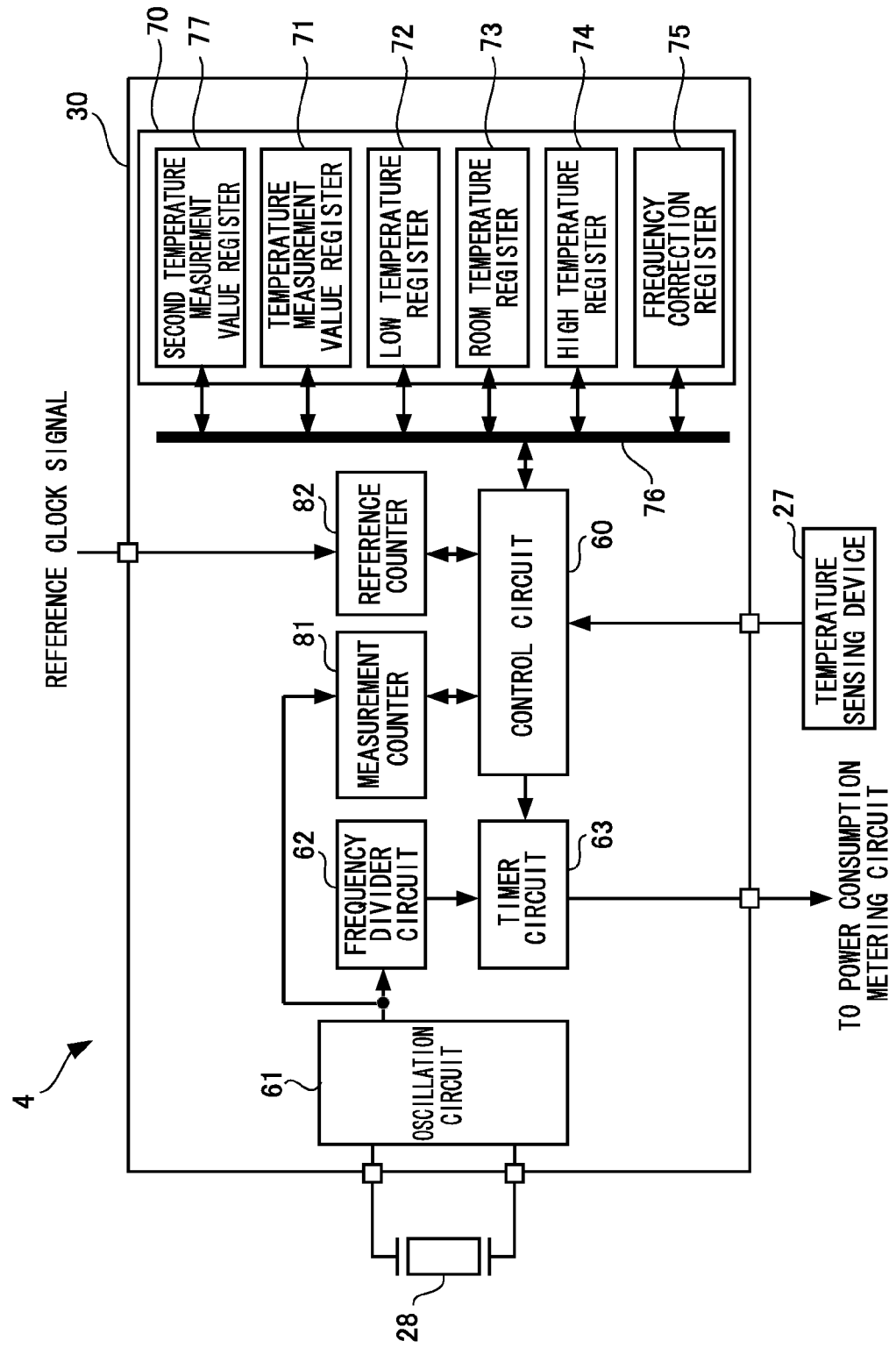
FIG. 19 is a functional block diagram illustrating a semiconductor device according to a fourth exemplary embodiment of the present invention.

FIG. 19 is a functional block diagram of a semiconductor device 4 according to the fourth exemplary embodiment of the present invention. The semiconductor device 4 differs from the semiconductor device 1 of the first exemplary embodiment described above in that a second temperature sensing register 77 is further included in a registry section 70 (see FIG. 6). The second temperature sensing register 77 is a resistor that in frequency correction processing manages a temperature measurement value acquired in the previous time of frequency correction processing. Since other configuration elements other than the second temperature sensing register 77 are similar to those of the semiconductor device 1 according to the first exemplary embodiment, explanation thereof is omitted. The semiconductor device 4 according to the present exemplary embodiment does not derive a new frequency correction amount when the difference between the temperature measurement value acquired during the current frequency correction processing and the temperature measurement value acquired during the previous time is lower that a frequency correction processing. The frequency correction amount derived during the previous time of frequency correction processing is accordingly applied as it is, and frequency correction processing performed.

Explanation follows regarding frequency correction processing in the semiconductor device 4 according to the present exemplary embodiment. Note that data storage processing (see FIG. 7) similar to that of the first exemplary embodiment is performed in preparation for this frequency correction processing, and a low temperature register 72, a room temperature register 73 and a high temperature register 74 are stored with temperature measurement values and frequency errors of an oscillation circuit 61 acquired in each of the respective temperature environments.

Figure 20:
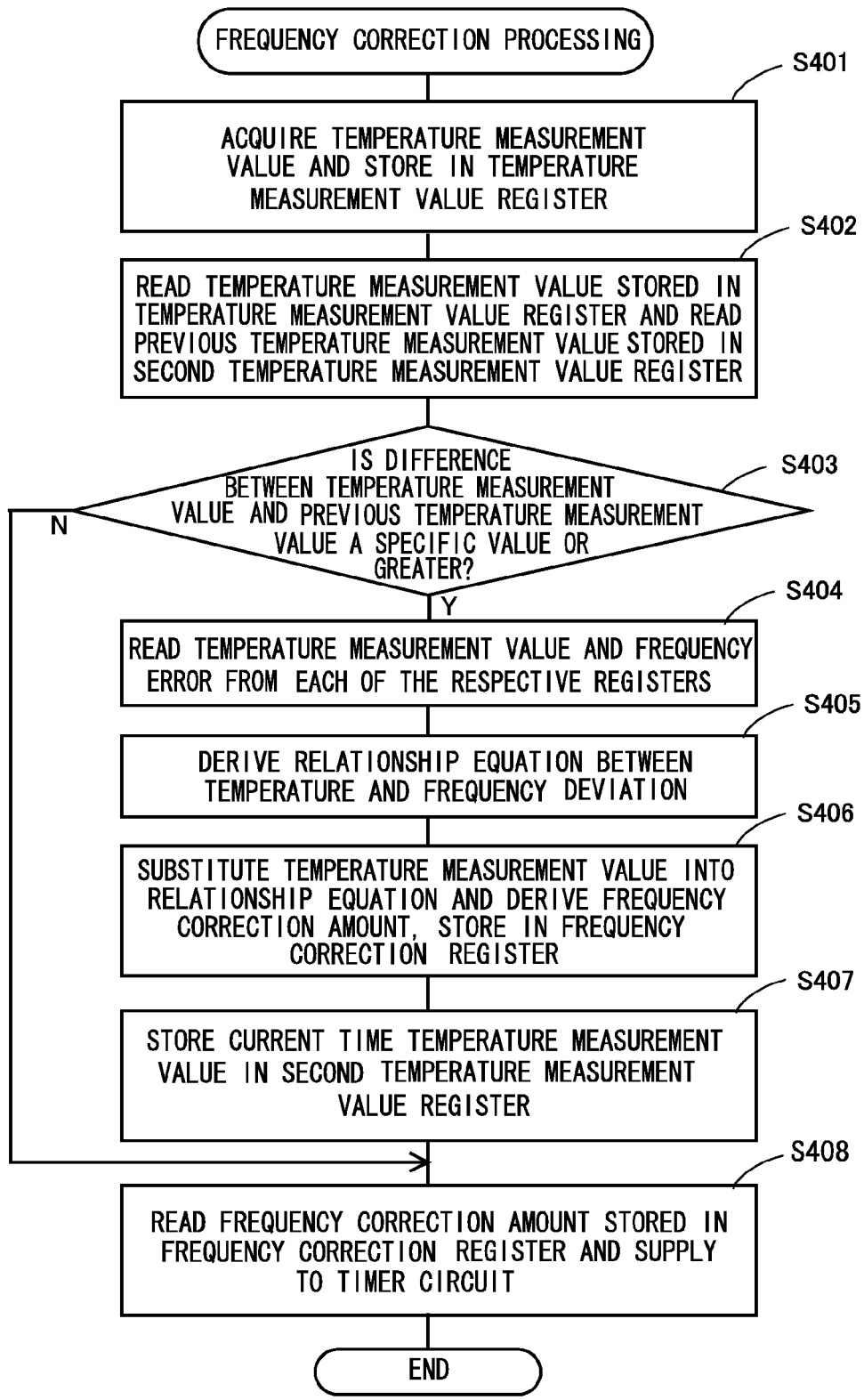
FIG. 20 is a flow chart illustrating a flow of frequency correction processing according to the fourth exemplary embodiment of the present invention.

In a state inbuilt into an integrating electricity meter 10 (see FIG. 1), a control circuit 60 executes a frequency correction processing program at each specific period, or at system reset or according to a control signal input through a lead 38. FIG. 20 is a flow chart illustrating a flow of processing of a frequency correction processing program according to the present exemplary embodiment executed in the control circuit 60. The program is pre-stored on a storage means (ROM) of the control circuit 60. Moreover, a temperature measurement value acquired in the previous time of frequency correction processing is stored in the second temperature sensing register 77.

At step S401, the control circuit 60 acquires the temperature measurement value using the temperature sensing device 27, and stores the acquired measurement value in the temperature measurement value register (the first temperature measurement value register) 71.

At step S402, the control circuit 60 reads the current time's temperature measurement value stored in the temperature measurement value register 71 and the previous time's temperature measurement value stored in the second temperature measurement value register.

At step S403, the control circuit 60 compares the previous time's temperature measurement value read from the temperature measurement value register 71 against the current time's temperature measurement value read from the second temperature sensing register 77, and determines whether or not the difference therebetween is a specific value (for example ±1° C.) or greater. Namely, the control circuit 60 determines whether or not the temperature change amount since the previous time's frequency correction processing is a specific value or greater. Processing proceeds to step S408 when the control circuit 60 determines that the difference between the previous time's temperature measurement value and the current time's temperature measurement value is less than the specific value. However, processing proceeds to step S404 when the control circuit 60 determines that the difference between the previous time's temperature measurement value and the current time's temperature measurement value is the specific value or greater.

At step S404, the control circuit 60 reads out the temperature measurement value and the frequency errors stored respectively in the low temperature register 72, the room temperature register 73 and the high temperature register 74.

At step S405, the control circuit 60 derives a relationship equation (frequency-temperature characteristics) representing the relationship between the temperature and the frequency error in the oscillation circuit 61 based on the temperature measurement values and the frequency errors read at step S404. Namely, the control circuit 60 derives the values of a, T0 and b by substituting the frequency errors read from each of the temperature registers 72 to 74 respectively as f and T in the Equation (1). The relationship equation between the temperature and frequency deviation (frequency-temperature characteristics) is thereby derived.

At step S406, the control circuit 60 derives, as the frequency correction amount, the frequency error at a temperature by substituting the current time's temperature measurement value stored in the temperature measurement value register 71 into the relationship equation derived at step S405, and stores this frequency correction amount in the frequency correction register 75.

At step S407, the control circuit 60 stores the current time's temperature measurement value that is stored in the temperature measurement value register 71 in the second temperature measurement value register. Namely, the value of the second temperature sensing register 77 is replaced by the current time's temperature measurement value.

At step S408, the control circuit 60 reads the frequency correction amount stored in the frequency correction register 75, supplies this value to the timer circuit 63 and then ends the current routine. The timer circuit 63 generates a timing signal of the frequency of the output signal from the frequency divider circuit 62 corrected based on the frequency correction amount supplied from the control circuit control circuit 60, and supplies is corrected signal to the power consumption metering circuit 22 (see FIG. 1).

As is clear from the above explanation, in the semiconductor device 4 according to the present exemplary embodiment, when the difference between the temperature measurement value acquired when executing the current time's frequency correction processing, and the temperature measurement value acquired when executing the frequency correction processing the previous time is less than the specific value, the control circuit 60 skips the processing of steps S404 to S407 (namely does not derive a new frequency correction amount), and supplies the frequency correction amount already stored in the frequency correction register 75 to the timer circuit 63. Thus processing to derive the frequency correction amount is omitted when a small temperature change has occurred since when the frequency correction processing was carried out the previous time, enabling a saving in power consumption to be achieve whilst still performing high precision time measurement. The semiconductor device 4 according to the present exemplary embodiment accordingly does not perform derivation of the frequency correction amount at a fixed interval. In order to execute processing irregularly according to changes in the peripheral temperature, consideration might for example be given to a configuration provided with plural frequency divider circuits, however the scale of the frequency divider circuits would become large in such cases to try to always accommodate various temperature environments. The semiconductor device 4 according to the present exemplary embodiment enables optimum frequency correction to be performed under various temperature environments without providing plural frequency divider circuits.

Note that although in the above exemplary embodiment derivation of a new frequency correction amount was not performed when the difference of the temperature measurement value to the temperature measurement value acquired when executing frequency correction processing the previous time is less than 1° C., it is possible to appropriately change the temperature setting value used as the determination standard for whether or not to perform frequency correction amount derivation. Moreover, the frequency correction processing according to the present exemplary embodiment may be implemented with any structure out of the semiconductor devices 1 to 3 according to the first to the third exemplary embodiment.

Fifth Exemplary Embodiment

Explanation follows regarding a semiconductor device according to a fifth exemplary embodiment of the present invention. It is known in oscillation circuits that employ quartz oscillators that deterioration of the quartz oscillator over the years is a cause of changes in oscillation frequency. It is therefore preferable to periodically correct the oscillation frequency of the oscillation circuit. There is therefore a need for an accurate clock to correct the oscillation frequency of the oscillation circuit, and correcting oscillation frequency with an accurate clock becomes difficult after shipping the semiconductor device, or after installing the semiconductor device in the installed device such as a measurement device. However in the semiconductor device of the present exemplary embodiment, even without using an accurate clock, it is possible to correct for not only frequency changes caused by changes in temperature, but also to correct for frequency changes caused by deterioration in an oscillator.

Figure 21:
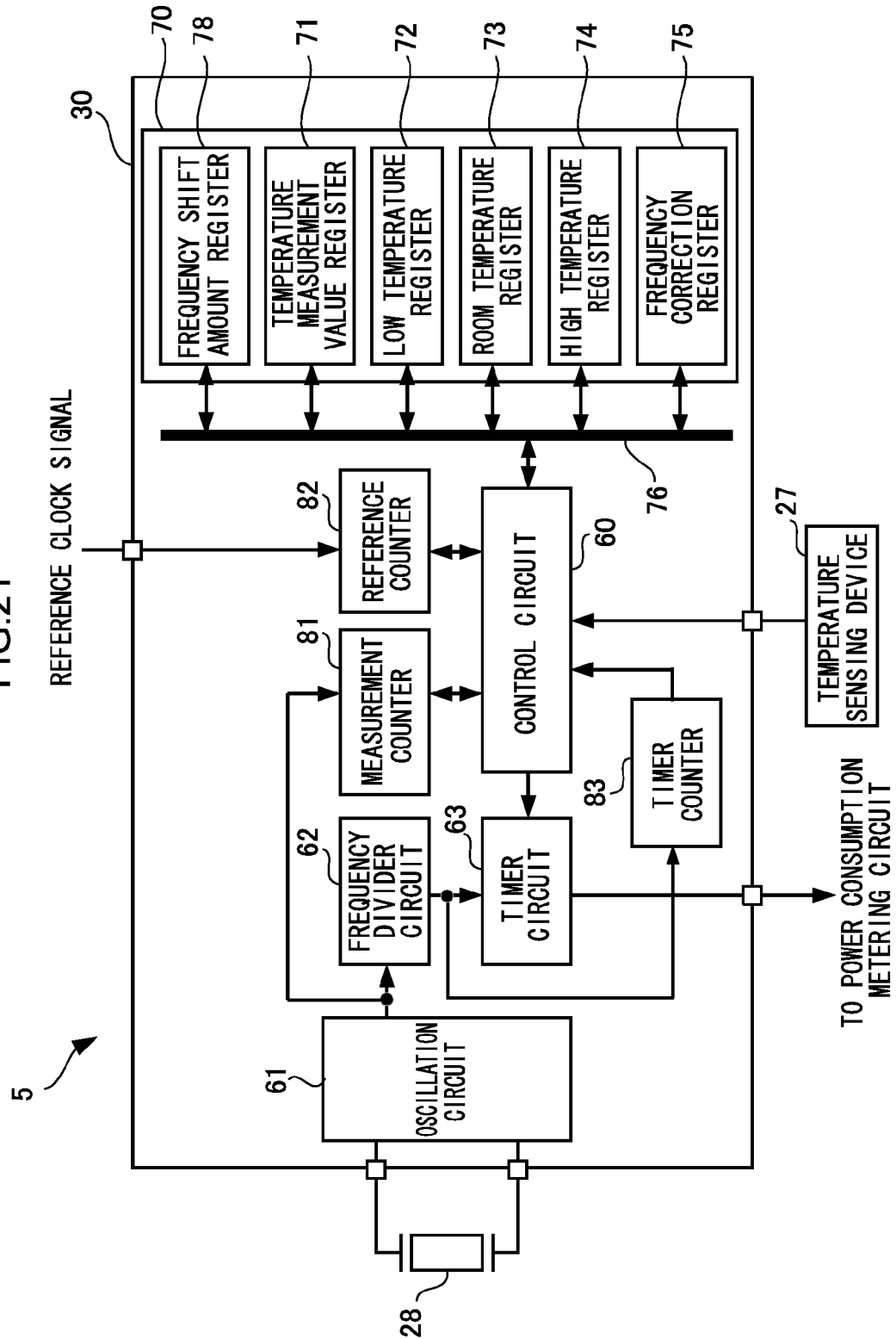
FIG. 21 is a functional block diagram of a semiconductor device according to a fifth exemplary embodiment of the present invention.

FIG. 21 is a functional block diagram of a semiconductor device 5 according to a fifth exemplary embodiment of the present invention. The semiconductor device 5 differs from the semiconductor device 1 according to the first exemplary embodiment described above (see FIG. 6) in that it further includes a timer counter 83 and a frequency shift amount register 78 in the registry section 70.

The timer counter 83 is connected to a frequency divider circuit 62 and is a counter that performs time measurement based on an output signal of the frequency divider circuit 62. The timer counter 83 supplies the control circuit 60 with cumulative time data that represents the cumulative time since for example the first time power was switched on, or since a reset input time.

The frequency shift amount register 78 is a dedicated non-volatile storage medium (ROM) for reading out stored frequency shift amount data for correcting for changes over the years in the oscillation frequency of the oscillation circuit 61 that accompany deterioration of the oscillator 28 over the years. The frequency shift amount register 78 is connected to the data bus 76, enabling the control circuit 60 to read frequency shift amount data stored in the frequency shift amount register 78.

Explanation follows regarding frequency shift amount data stored in the frequency shift amount register 78. As described above, the oscillation frequency of the oscillation circuit 61 shifts to the high frequency side or the low frequency side accompanying deterioration over the years of the oscillator 28. One example of a cause of deterioration of the oscillator 28 over the years is adherence to the quartz vibrating reed of foreign bodies given off in minute amounts from for example the package. What is referred to as a shift in the oscillation frequency of the oscillation circuit 61 accompanying deterioration over the years in the oscillator 28 means that the quadratic curve representing the frequency-temperature characteristics illustrated in FIG. 11 is shifted overall in the up or down direction. The manner of change, such as the shift direction and shift amount of the oscillation frequency depends on such factors as the type of oscillator and the manufacturing method of the oscillator. However, there is not a large individual variation between the manner in which the oscillation frequency changes as long as they are the same type of oscillator and use the same manufacturing method. The frequency shift amount register 78 is stored with estimate values of the frequency shift amount of the oscillation circuit 61 for each specific period (for example every year) as frequency shift amount data. The frequency shift amount of the oscillation circuit 61 for specific periods may be known from executing accelerated aging tests such as for example high temperature exposure tests. In the present exemplary embodiment, the oscillation frequency of the oscillation circuit 61 is confirmed by accelerated aging tests to shift by 0.6 ppm±0.4 ppm each year, and 0.6 ppm is stored in the frequency shift amount register 78 as the frequency shift amount data. When executing frequency correction processing, the control circuit 60 reads the frequency shift amount data stored in the frequency shift amount register 78, and derives a frequency correction amount required to correct for the change over the years in the oscillation frequency of the oscillation circuit 61. The configuration elements other than the timer counter 83 and the frequency shift amount register 78 are similar to those of the semiconductor device 1 according to the first exemplary embodiment described above, and so further explanation thereof is omitted.

Explanation follows regarding frequency correction processing in the semiconductor device 5 according to the present exemplary embodiment. Note that in advance of the frequency correction processing, data storage processing is executed similarly to as in the first exemplary embodiment described above (see FIG. 7), and temperature measurement values and frequency errors of the oscillation circuit 61 acquired under each of the temperature environments are stored in a low temperature register 72, a room temperature register 73 and a high temperature register 74. Moreover, a frequency shift amount of 0.6 ppm every year is stored as the frequency shift amount data in the frequency shift amount register 78.

Figure 22:
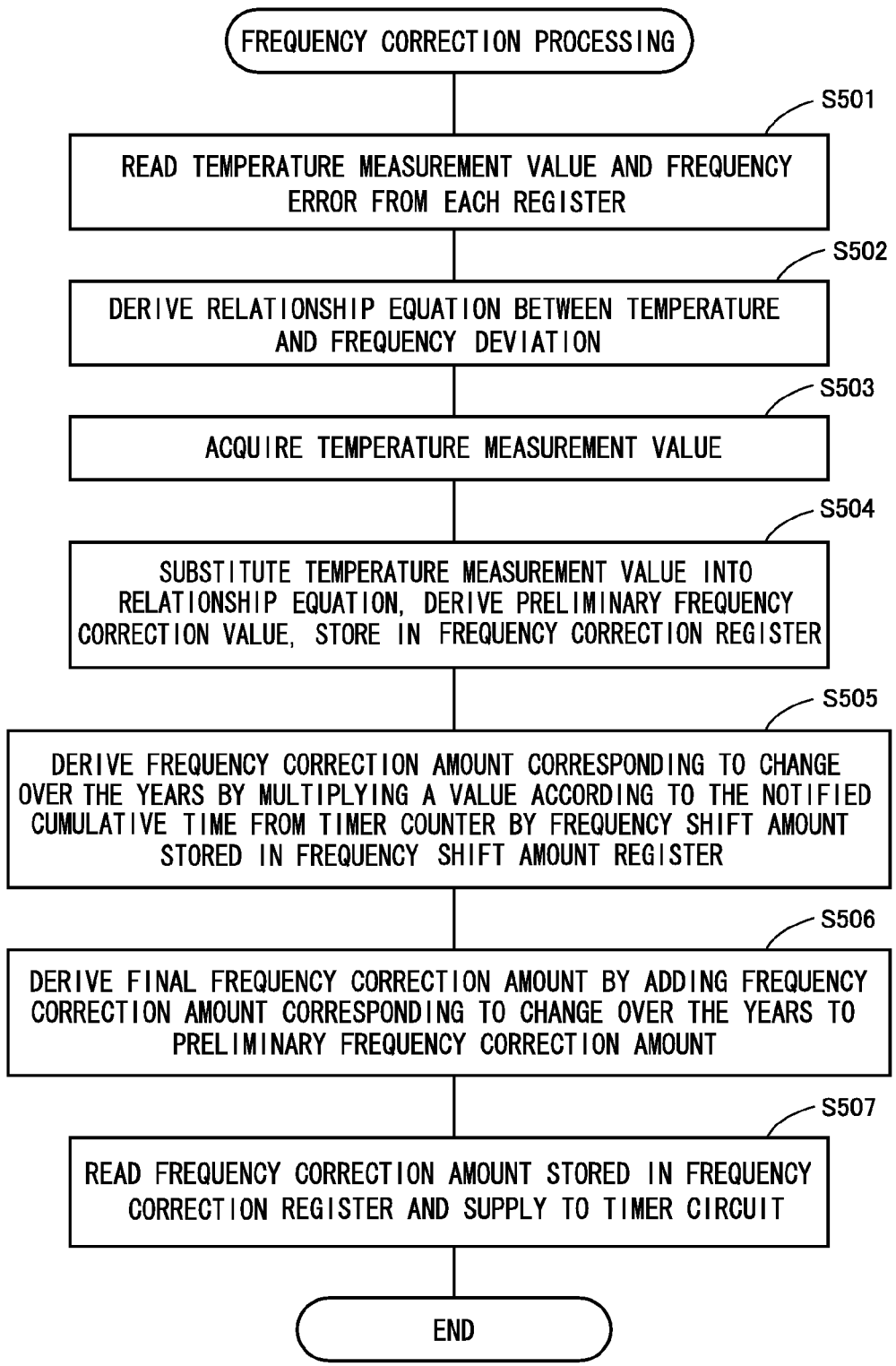
FIG. 22 is a flow chart illustrating a flow of frequency correction processing according to the fifth exemplary embodiment of the present invention.

In an installed state in an integrating electricity meter 10 (see FIG. 1), the control circuit 60 executes a frequency correction processing program every specific period, or in response to input of a control signal through the lead 38, such as on system reset. FIG. 22 is a flow chart that illustrates a flow of processing of a frequency correction processing program according to the present exemplary embodiment executed in the control circuit 60. The program is stored in advance in a storage means (ROM) of the control circuit 60.

At step S501, the control circuit 60 reads the temperature measurement values and frequency errors stored in each of the low temperature register 72, the room temperature register 73 and the high temperature register 74.

At step S502, the control circuit 60 derives a relationship equation (frequency-temperature characteristics) between temperature and frequency deviation in the oscillation circuit 61 based on the temperature measurement values and frequency errors read at step S501. Namely, the control circuit 60 derives values of the a, T0 and b by substituting the frequency errors and temperature measurement values read from each of the registers 72 to 74 as f and T in Equation (1), and thereby derives a relationship equation between the temperature and the frequency deviation (frequency-temperature characteristics) in the oscillation circuit 61.

At step S503, the control circuit 60 acquires the temperature measurement values by the temperature sensing device 27 and stores the acquired measurement values in the temperature measurement value register 71.

At step S504, the control circuit 60 substitutes the temperature measurement value stored in the temperature measurement value register 71 into the relationship equation derived at step S502, and derives a preliminary frequency correction amount (first frequency correction amount) of the frequency deviation at that temperature, and temporarily stores this value in the frequency correction register 75.

At step S505, the control circuit 60 derives a frequency correction amount (second frequency correction amount) corresponding to change over the years by multiplying a notified cumulative time from the timer counter 83 by the frequency shift amount (0.6 ppm) stored in frequency shift amount register 78. For example, in a case in which the notified cumulative time from the timer counter 83 is less than one year, the frequency shift amount (0.6 ppm) stored in the frequency shift amount register 78 is multiplied by 0 to derive 0 as the frequency correction amount corresponding to the change over the years. However, when the cumulative time notified from the timer counter 83 is 1 year or more but less than 2 years, then the control circuit 60 multiplies the frequency shift amount (0.6 ppm) stored in the frequency shift amount register 78 by 1 to derive the frequency shift amount (0.6 ppm) corresponding to the change over the years. Moreover, when the cumulative time notified from the timer counter 83 is 2 years or more but less than 3 years, then the control circuit 60 multiplies the frequency shift amount (0.6 ppm) stored in the frequency shift amount register 78 by 2 to derive the frequency shift amount (1.2 ppm) corresponding to the change over the years.

At step S506, the control circuit 60 derives the final frequency correction amount by adding the frequency correction amount corresponding to change over the years derived at step S505 (the second frequency correction amount) to the preliminary frequency correction amount stored in the frequency correction register 75 (the first frequency correction amount), and stores the final frequency correction amount in the frequency correction register 75.

At step S507, the control circuit 60 supplies the final frequency correction amount stored in the frequency correction register 75 to the timer circuit 63 and ends the current routine. The timer circuit 63 generates a timing signal of the frequency of the output signal of the frequency divider circuit 62 corrected based on the frequency correction amount supplied from the control circuit 60, and supplied the generated corrected timing signal to the power consumption metering circuit 22 (see FIG. 1).

Thus, according to the semiconductor device 5 of the present exemplary embodiment, since the oscillation frequency of the oscillation circuit 61 is corrected for change over the years without employing an accurate clock, this enables time measurement to be performed at high precision over a long period of time even after product shipment or after installing in an apparatus.

Note that in the above exemplary embodiment, an example has been illustrated in which the frequency correction amount corresponding to the change over the years is derived by increasing the frequency shift amount stored in the frequency shift amount register 78 for every year, in the series 1 times (0.6 ppm), 2 times (1.2 ppm), 3 times (1.8 ppm), and so on), however there is no limitation thereto. It is known that the change over the years in the oscillation frequency of oscillation circuits containing quartz oscillators are indications of the saturation characteristics. Thus the frequency shift amount for each year may be stored in advance in the frequency shift amount register 78 so as to match the saturation characteristics. For example, 0.6 ppm may be stored in the frequency shift amount register 78 as the frequency shift amount after 1 year but less than 2 years, 0.4 ppm may be stored as the frequency shift amount after 2 years but less than 3 years, 0.2 ppm may be stored as the frequency shift amount after 3 years but less than 4 years, and 0 ppm may be stored as the frequency shift amount after 4 years. In such cases, the control circuit 60 derives 0.6 ppm as the frequency correction amount corresponding to the change over the years after 1 year but less than 2 year, derives 1.0 ppm (0.6+0.4 ppm) as the frequency correction amount corresponding to the change over the years after 2 years but less than 3 years, and derives 1.2 ppm (1.0+0.2 ppm) as the frequency correction amount corresponding to the change over the years after 3 years. Moreover, the exemplary embodiment described above is an example in which the frequency correction amount corresponding to change over the years is changed each time 1 year elapses, however the frequency correction amount corresponding to the change over the years may be changed at longer or shorter intervals than 1 year.

Figure 23:
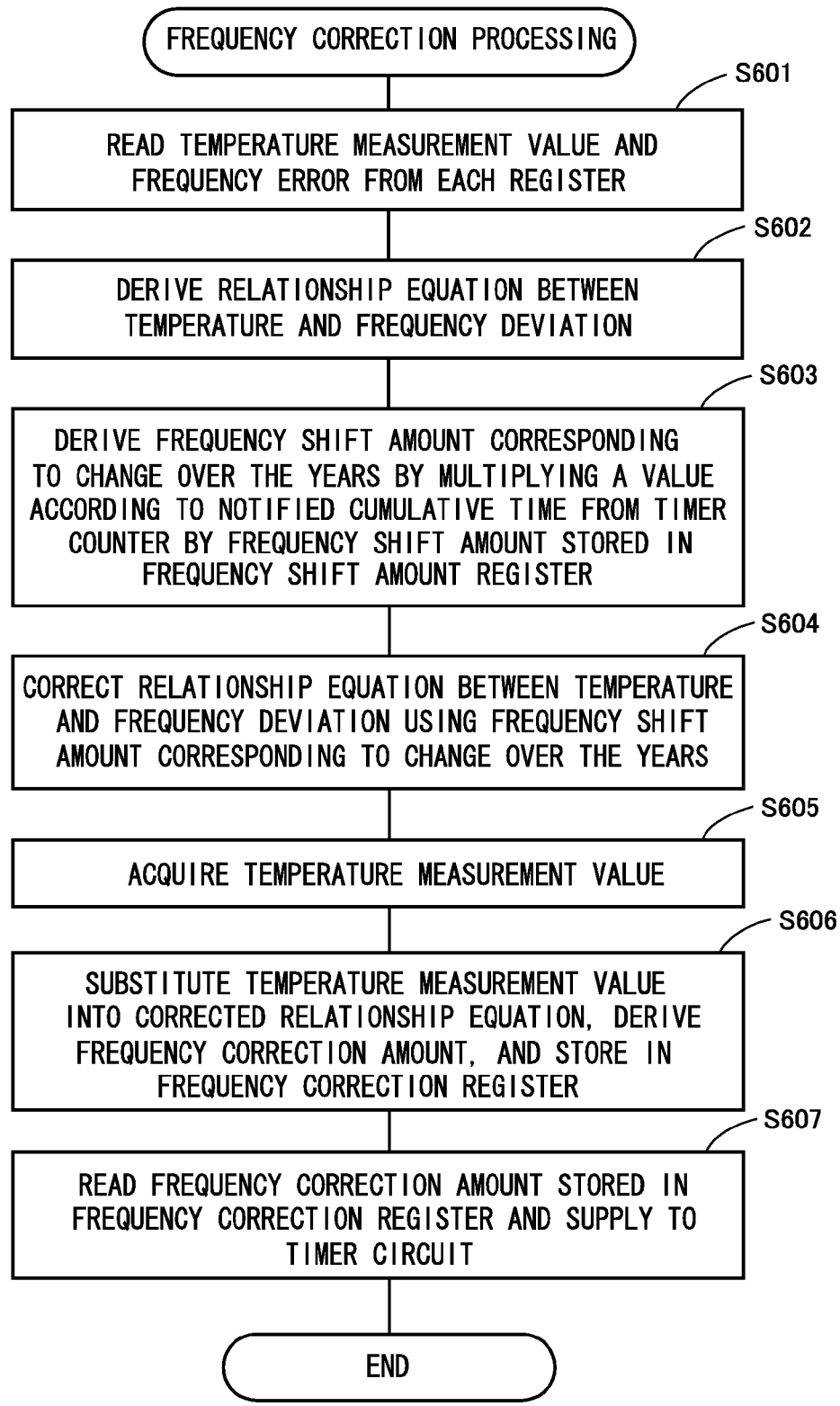
FIG. 23 is a flow chart illustrating another flow of frequency correction processing according to the fifth exemplary embodiment of the present invention.

Moreover, although in the above exemplary embodiment, at step S506 the final frequency correction amount is computed by adding the frequency correction amount corresponding to the change over the years derived at step S505 to the preliminary frequency correction amount stored in the frequency correction register 75, there is no limitation thereto. FIG. 23 is a flow chart illustrating another mode of frequency correction processing according to the present exemplary embodiment.

At step S601, the control circuit 60 reads temperature measurement values and the frequency errors stored in the low temperature register 72, the room temperature register 73 and the high temperature register 74.

At step S602, the control circuit 60 derives a relationship equation (frequency-temperature characteristics) between temperature and frequency deviation in the oscillation circuit 61 based on the temperature measurement values and the frequency errors read at step S601. Namely, the control circuit 60 derives values of the a, T0 and b by substituting the frequency errors and temperature measurement values read from each of the registers 72 to 74 as f and T in Equation (1), and thereby derives a relationship equation (frequency-temperature characteristics) between the temperature and the frequency deviation.

At step S603, the control circuit 60 derives the frequency shift amount corresponding to change over the years as a value obtained by multiplying the notified cumulative time from timer counter 83 by the frequency shift amount stored in frequency shift amount register 78. For example, in a case in which the notified cumulative time from the timer counter 83 is less than one year, the control circuit 60 derives a frequency shift amount of 0 corresponding to the change over the years by multiplying the frequency shift amount (0.6 ppm) stored in the frequency shift amount register 78 by 0. However, when the cumulative time notified from the timer counter 83 is 1 year or more but less than 2 years, then the control circuit 60 multiplies the frequency shift amount (0.6 ppm) stored in the frequency shift amount register 78 by 1 to derive a frequency shift amount corresponding to the change over the years (0.6 ppm). Moreover, when the cumulative time notified from the timer counter 83 is 2 years or more but less than 3 years, then the control circuit 60 multiplies the frequency shift amount (0.6 ppm) stored in the frequency shift amount register 78 by 2 to derive the frequency shift amount corresponding to the change over the years (1.2 ppm).

At step S604, the control circuit 60 corrects the relationship equation derived at step S602 using the frequency shift amount corresponding to change over the years derived at step S603. Namely, at step S602, since the relationship equation between temperature and frequency deviation derived at step S602 does not include the change over the years, the control circuit 60 makes an overall shift in the quadratic curve of the frequency-temperature characteristics to reflect the component from change over the years by adding the frequency shift amount corresponding to the change over the years derived at step S603 to the apex error b of the relationship equation derived at step S602.

At step S605, the control circuit 60 acquires the temperature measurement value of the temperature sensing device 27 and stores the acquired measurement value in the temperature measurement value register 71.

At step S606, the control circuit 60 derives as a frequency correction amount a frequency deviation at the relevant temperature by substituting the temperature measurement value stored in the temperature measurement value register 71 into the relationship equation corrected at step S604, and stores this in the frequency correction register 75.

At step S607, the control circuit 60 supplies correction data representing the frequency correction amount stored in frequency correction register 75 to the timer circuit 63, and ends the current routine. The timer circuit 63 generates a timing signal that is the frequency of the output signal of the frequency divider circuit 62 corrected based on the correction data supplied from the control circuit 60, and supplies these to the power consumption metering circuit 22 of the following stage (see FIG. 1).

Note that it is possible to implement the frequency correction processing according to the present exemplary embodiment in a structure of any of the semiconductor devices 1 to 3 according to the first to the third exemplary embodiments.

Sixth Exemplary Embodiment

Figure 24:
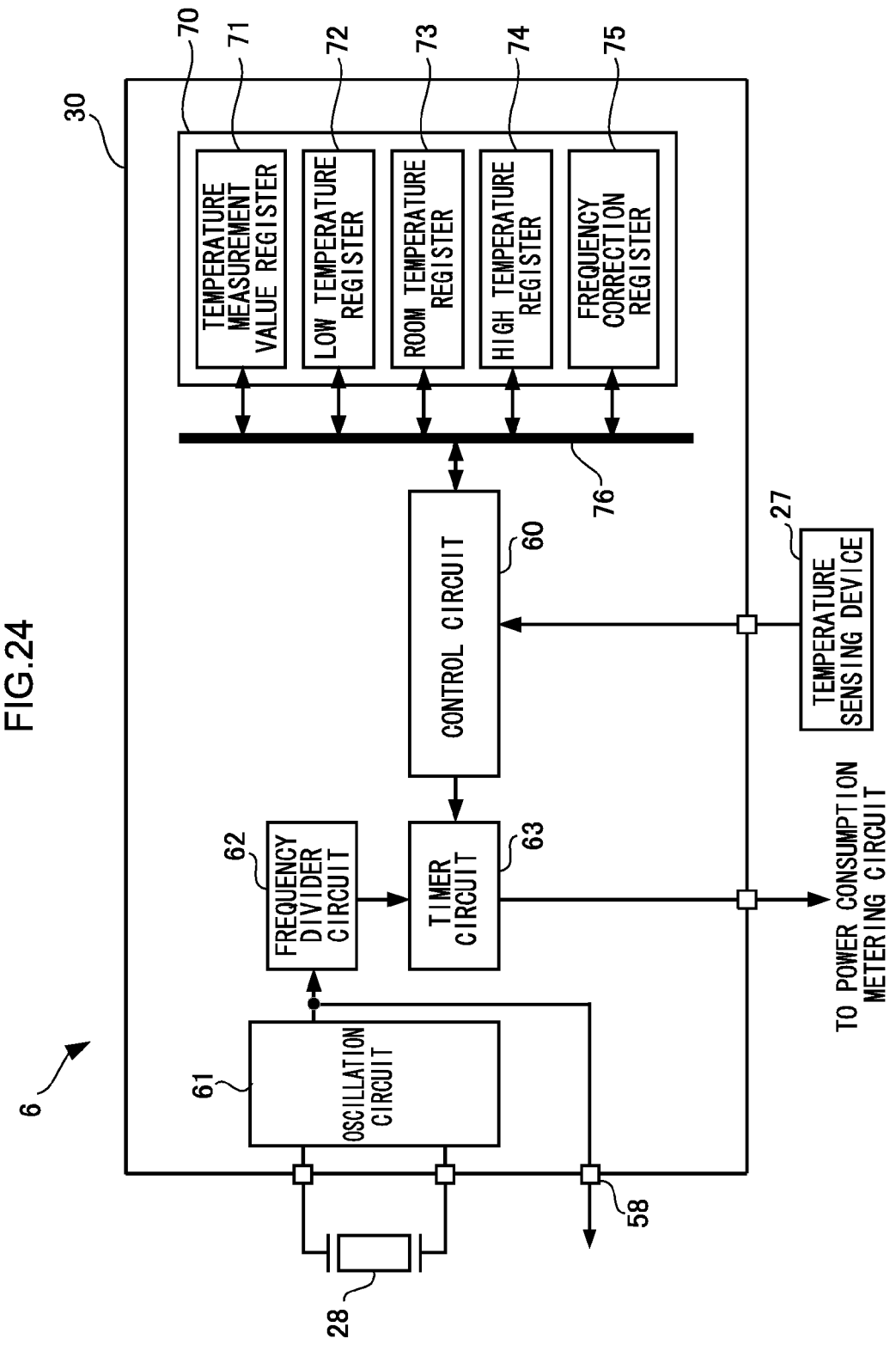
FIG. 24 is a functional block diagram of a semiconductor device according to a sixth exemplary embodiment of the present invention.

FIG. 24 is a functional block diagram illustrating a configuration of a semiconductor device 6 according to a sixth exemplary embodiment of the present invention. The semiconductor device 6 differs from the semiconductor device 1 according to the first exemplary embodiment in the points that the semiconductor chip 30 includes an electrode pad 58 connected to an output terminal of the oscillation circuit 61, and in that it is not provided with a measurement counter or a reference counter. The electrode pad 58 is connected to the lead 38 through a bonding wire, thereby enabling external acquisition of the output signal of the oscillation circuit 61. In the present exemplary embodiment, the frequency error of the oscillation circuit 61 is acquired for each of the temperature environments by measuring output signals of the oscillation circuit 61 externally acquired in each of the temperature environments of low temperature, room temperature, and high temperature. Namely, the frequency errors of the oscillation circuit 61 in each of the temperature environments are acquired externally to the semiconductor device 6. The frequency error of the oscillation circuit 61 supplied from externally is stored as temperature measurement values in the low temperature register 72, the room temperature register 73 and the high temperature register 74. According to the semiconductor device 6 of the present exemplary embodiment, the derivation processing of the frequency errors is performed externally, eliminating the need for the measurement counter 81 and the reference counter 82 of the first exemplary embodiment described above, and thereby enabling the size of the semiconductor chip 30 to be made smaller.

Modified Example

Figure 25:
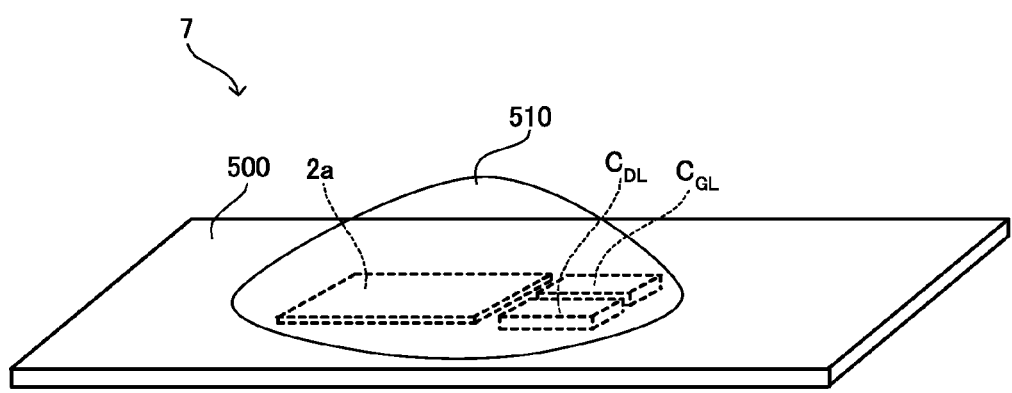
FIG. 25 is a perspective view illustrating a configuration of a semiconductor module according to an exemplary embodiment of the present invention.

FIG. 25 is a perspective view illustrating a configuration of a semiconductor module 7 according to a modified example of the present invention. The semiconductor module 7 is configured including a semiconductor device 2a mounted on a reference board 500, capacitors CGL and CDL that are mounted on the reference board 500 and are connected to the semiconductor device 2a, and molding resin 510 that serves as a sealing member for these members mounted on the reference board 500. The semiconductor device 2a is the semiconductor device 2 according to the second exemplary embodiment described above, with the capacitors CGL and CDL removed. Namely, the semiconductor module 7 has the capacitors CGL and CDL of the semiconductor device 2 according to the second exemplary embodiment described above removed and connected to the semiconductor device 2a on the reference board 500. According to such a configuration, although frequency correction processing cannot be executed by the semiconductor device 2a on its own, it is possible to perform frequency correction as the semiconductor module 7.

Normally an exterior mounted metering apparatus such as an electricity meter or a gas meter is liable to being affected by the external environment. The resonance frequency of quartz oscillators widely employed for time measurement circuits fluctuates according the peripheral temperature. Thus the oscillation frequency of an oscillation circuit including an oscillator changes according to peripheral temperature variations. Thus accurate time measurements can no longer be performed when the oscillation frequency of the oscillation circuit fluctuates. In particular, there is a need for measurement instruments such as electricity meters to always perform time measurements at high precision. To address this, semiconductor devices that include timing functions and are in-built into measuring instruments such as electricity meters use temperature sensing devices (temperature sensors) to measure the temperature of the oscillator and to perform correction for the fluctuation amount in the oscillation frequency. In such cases, there is a need to accurately measure the temperature of the oscillator using the temperature sensing device in order to perform appropriated frequency correction.

For example, in a configuration with a temperature sensing device in-built into an IC chip, it is difficult to accurately measure the temperature of the oscillator due to the temperature sensing device being affected by heat from the semiconductor chip. Moreover, as the temperature sensing device in-built into a semiconductor chip there is the assumption that utilization is made of one with temperature characteristics of forward direction voltage VF in a pn junction, however it is difficult to perform temperature measurement at high precision since the change in output signal with temperature of such a temperature sensing device is small and yet has a large variation. Thus with a temperature sensing device in-built into a semiconductor chip, it is difficult to perform correction at high precision of the fluctuation amount of oscillation frequency accompanying changes in temperature.

However, in an oscillation circuit employing an oscillator such as a quartz oscillator, a capacitor for forming a resonance circuit is connected to the oscillator. Building this capacitor into the semiconductor chip enables the number of components to be reduced. However, the capacitor configuring the semiconductor needs to have a comparatively large surface area within the semiconductor chip, with an accompany increase in the chip size. Consequently, sometimes building a capacitor into the semiconductor chip actually results in an increase in cost. Moreover, a capacitor configuring a semiconductor has larger variation in capacitance values and larger capacitance value fluctuation to temperature changes compared to discrete components such a ceramic condenser, making it difficult to make high precision changes in the oscillation frequency.

Thus although building a temperature sensing device and a capacitor into a semiconductor chip enables a reduction to be made in the number of components, it becomes difficult to achieve high precision of oscillation frequency of the oscillation circuit across the range of usage temperatures, and it is difficult to perform accurate timing measurements.

The present invention provides a semiconductor device with a time measurement function capable of performing more accurate timing measurements, and a metering device including such semiconductor device.

What is claimed is:

1. A semiconductor device comprising:
   an oscillator;
   a semiconductor chip that includes:
      an oscillation circuit that is connected to the oscillator,
      a timer circuit that generates a timing signal of a frequency according to an oscillation frequency of the oscillation circuit, and
      a frequency correction section that corrects a frequency of the timing signal based on temperature data;
   a lead frame that the oscillator and the semiconductor chip are mounted on, the lead frame having a through hole between the oscillator and the semiconductor chip, wherein the oscillator and the semiconductor chip are contained within a single package; and
   a bonding wire, the oscillator being electrically connected to the semiconductor chip through the bonding wire via the through hole, wherein
   the oscillator is mounted on a first main face of the lead frame,
   the semiconductor chip is mounted on a second main face, that is on the opposite side of the lead frame to the first main face,
   the through hole is included between the oscillator and the semiconductor chip in a direction that intersects with the first main face and the second main face,
   the through hole of the lead frame exposes a terminal portion of the oscillator to the second main face side, and
   the bonding wire is connected to the terminal portion of the oscillator that is exposed to the second main face side through the through hole.

2. The semiconductor device of claim 1, wherein the through hole includes two through holes, and the oscillator is mounted on a beam of the lead frame that is disposed between the two through holes in a direction that is parallel to the first main face and the second main face of the lead frame.

3. The semiconductor device of claim 1, wherein the oscillator is provided at a position that overlaps with the semiconductor chip in a direction parallel to the first main face and the second main face.

4. The semiconductor device of claim 1, further comprising:
   a temperature sensing device that detects a peripheral temperature, that supplies the detected temperature as temperature data to the frequency correction section, and that is provided as a separate body from the semiconductor chip, the temperature sensing device being mounted on the lead frame; and
   another bonding wire electrically connecting the temperature sensing device to the semiconductor chip.

5. The semiconductor device of claim 4, wherein
   the temperature sensing device is mounted on the first main face of the lead frame.

6. The semiconductor device of claim 5, wherein
   the through hole includes through holes with one of the through holes of the lead frame exposing a terminal portion of the temperature sensing device to the second main face side, and
   the another bonding wire is connected to the terminal portion of the temperature sensing device that is exposed to the second main face side through the one through hole.

7. The semiconductor device of claim 6, wherein
the oscillator is mounted on a beam of the lead frame that is disposed between two of the through holes in a direction that is parallel to the first main face and the second main face of the lead frame, and
the temperature sensing device is mounted on another beam of the lead frame that is disposed between another two of the through holes in a direction that is parallel to the first main face and the second main face of the lead frame.

8. The semiconductor device of claim 5, wherein the oscillator and the temperature sensing device are provided at positions that overlap with the semiconductor chip in a direction that is parallel to the first main face and the second main face.

9. The semiconductor device of claim 1, wherein
the through hole is included between the oscillator and the semiconductor chip in a direction that is parallel to the first main face.

10. The semiconductor device of claim 1, wherein the bonding wire penetrates through the through hole to connect to the terminal portion of the oscillator.

11. A metering apparatus, comprising:
a semiconductor device that includes:
an oscillator;
a semiconductor chip that includes:
an oscillation circuit that is connected to the oscillator,
a timer circuit that generates a timing signal of a frequency according to an oscillation frequency of the oscillation circuit,
a frequency correction section that corrects a frequency of the timing signal based on temperature data, and
a measurement section that measures a measurement target associated with timing data generated based on the timing signal;
a lead frame that the oscillator and the semiconductor chip are mounted on, the lead frame having a through hole between the oscillator and the semiconductor chip,
a bonding wire, the oscillator being electrically connected to the semiconductor chip through the bonding wire via the through hole,
wherein the oscillator and the semiconductor chip are contained within a single package,
wherein the lead frame has opposite first and second main faces which are respectively on opposite first and second main face sides of the lead frame,
the bonding wire is connected to a terminal portion of the oscillator that is exposed to the second main face side, and
the bonding wire penetrates through the through hole to connect to the terminal portion of the oscillator.

12. A semiconductor device comprising:
an oscillator;
a semiconductor chip that includes:
an oscillation circuit that is connected to the oscillator,
a timer circuit that generates a timing signal of a frequency according to an oscillation frequency of the oscillation circuit, and
a frequency correction section that corrects a frequency of the timing signal based on temperature data; and
a lead frame that the oscillator and the semiconductor chip are mounted on, the lead frame having a through hole between the oscillator and the semiconductor chip, wherein
the oscillator and the semiconductor chip are contained within a single package, wherein:
the oscillator is mounted on a first main face of the lead frame,
the semiconductor chip is mounted on a second main face of the lead frame that is on a second main face side that is the opposite side of the lead frame to the first main face,
the through hole is included between the oscillator and the semiconductor chip in a direction that intersects with the first main face and the second main face,
the through hole of the lead frame exposes a terminal portion of the oscillator to the second main face side, and
the semiconductor device further comprises a bonding wire connected to the terminal portion of the oscillator that is exposed to the second main face side through the through hole.

* * * * *